United States Patent
Katsuhara

(10) Patent No.: US 9,601,596 B2
(45) Date of Patent: Mar. 21, 2017

(54) ELECTRONIC DEVICE AND METHOD OF MANUFACTURING SEMICONDUCTOR DEVICE

(71) Applicant: Sony Corporation, Tokyo (JP)

(72) Inventor: Mao Katsuhara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/338,477

(22) Filed: Jul. 23, 2014

(65) Prior Publication Data

US 2015/0017766 A1 Jan. 15, 2015

Related U.S. Application Data

(62) Division of application No. 13/914,968, filed on Jun. 11, 2013, now Pat. No. 8,802,491, which is a division of application No. 13/488,835, filed on Jun. 5, 2012, now Pat. No. 8,823,105.

(30) Foreign Application Priority Data

Jul. 4, 2011 (JP) ................................ 2011-148018

(51) Int. Cl.
*H01L 51/40* (2006.01)
*H01L 29/66* (2006.01)
*H01L 51/05* (2006.01)
*H01L 51/00* (2006.01)

(52) U.S. Cl.
CPC .... *H01L 29/66742* (2013.01); *H01L 51/0512* (2013.01); *H01L 51/0562* (2013.01); *H01L 51/0051* (2013.01); *H01L 51/0074* (2013.01)

(58) Field of Classification Search
CPC ............. H01L 51/0512; H01L 51/0562; H01L 51/0566; H01L 51/0051; H01L 29/66742
USPC ........... 438/99, 161, 165, 652; 257/353, 40, 257/E51.025, E51.006, E21.158
See application file for complete search history.

(56) References Cited

U.S. PATENT DOCUMENTS

| 2005/0285101 A1 | 12/2005 | Hanson et al. |
| 2006/0081840 A1 | 4/2006 | Mori et al. |
| 2006/0284171 A1 | 12/2006 | Levy et al. |
| 2007/0085112 A1* | 4/2007 | Yamazaki et al. ............ 257/288 |
| 2011/0037065 A1 | 2/2011 | Ueno et al. |
| 2013/0009135 A1 | 1/2013 | Katsuhara |

(Continued)

FOREIGN PATENT DOCUMENTS

| JP | 2005-327797 A | 11/2005 |
| JP | 2006-253675 A | 9/2006 |

OTHER PUBLICATIONS

U.S. Appl. No. 13/488,835, filed Jun. 5, 2012, Katsuhara.
U.S. Appl. No. 13/914,968, filed Jun. 11, 2013, Katsuhara.

*Primary Examiner* — Tu-Tu Ho
(74) *Attorney, Agent, or Firm* — Hazuki International, LLC

(57) ABSTRACT

There is provided an electronic device including at least a first electrode, a second electrode disposed to be spaced apart from the first electrode, and an active layer disposed over the second electrode from above the first electrode and formed of an organic semiconductor material. A charge injection layer is formed between the first electrode and the active layer and between the second electrode and the active layer, and the charge injection layer is formed of an organic material having an increased electric conductivity when the charge injection layer is oxidized.

7 Claims, 9 Drawing Sheets

(56) References Cited

U.S. PATENT DOCUMENTS

2013/0273689 A1    10/2013    Katsuhara

* cited by examiner

FIG. 1A [PROCESS-110]
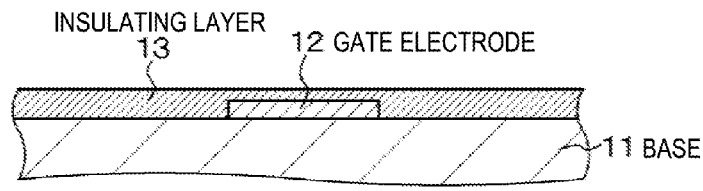
FIG. 1B [PROCESS-120]
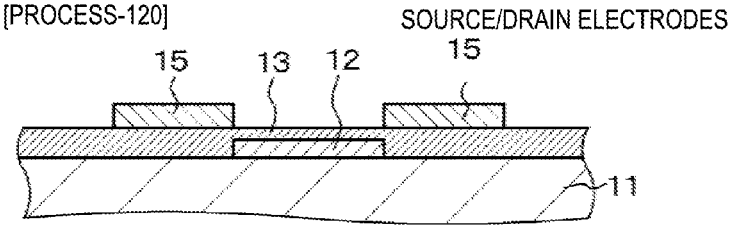
FIG. 1C [PROCESS-130]
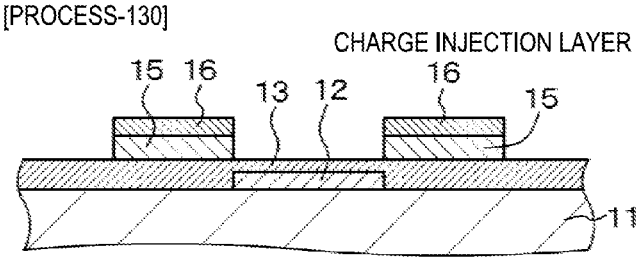
FIG. 1D [PROCESS-140]
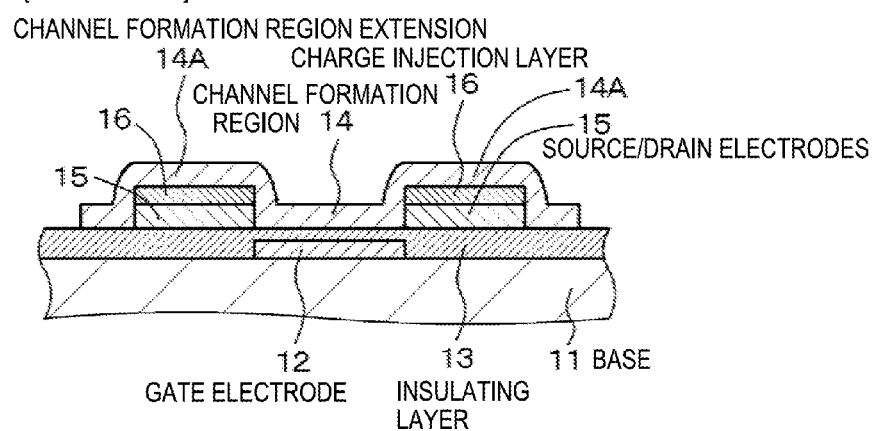

FIG. 2A [PROCESS-200]
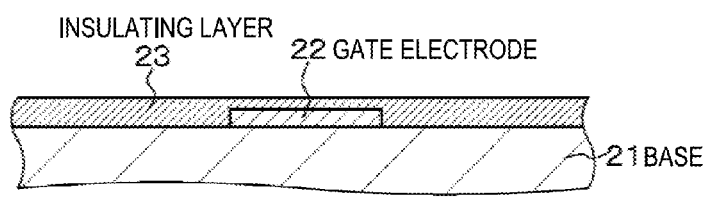
FIG. 2B [PROCESS-210]
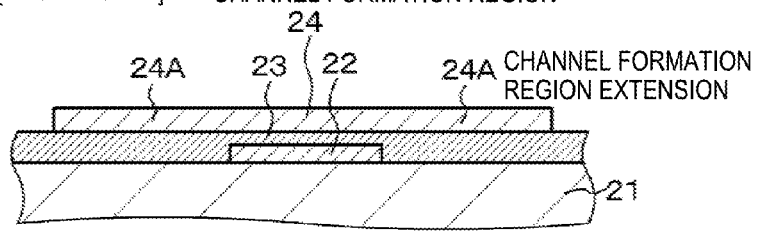
FIG. 2C [PROCESS-220]
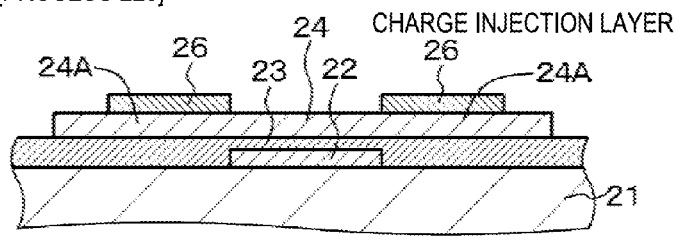
FIG. 2D [PROCESS-230]
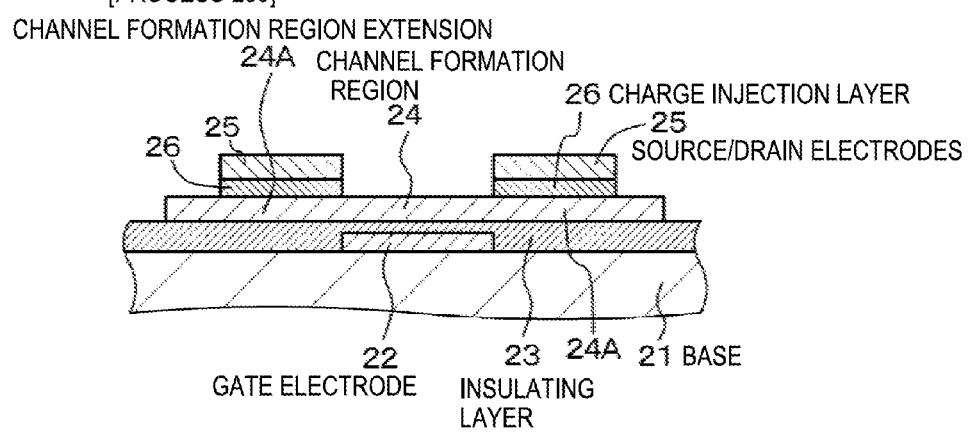

[THIRD EMBODIMENT]
FIG. 3A [PROCESS-310]
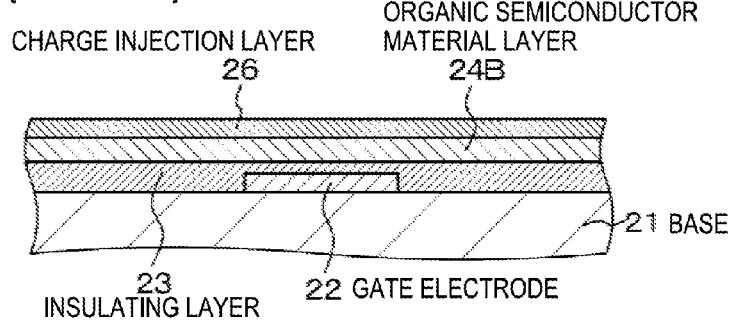
FIG. 3B [PROCESS-310] (CONTINUED)
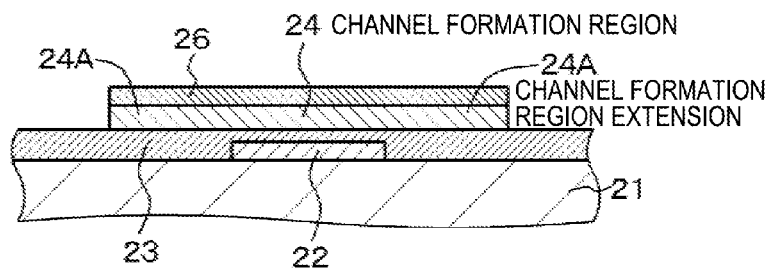
FIG. 3C [PROCESS-320]
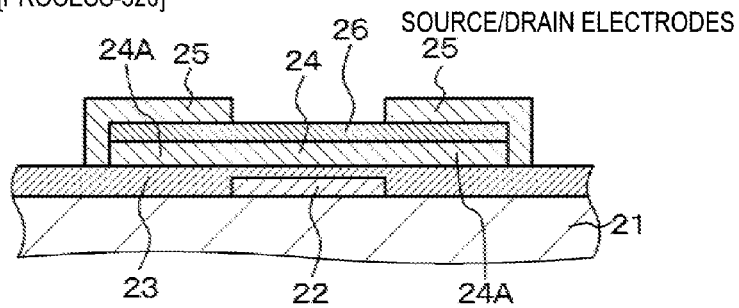
FIG. 3D [PROCESS-330]
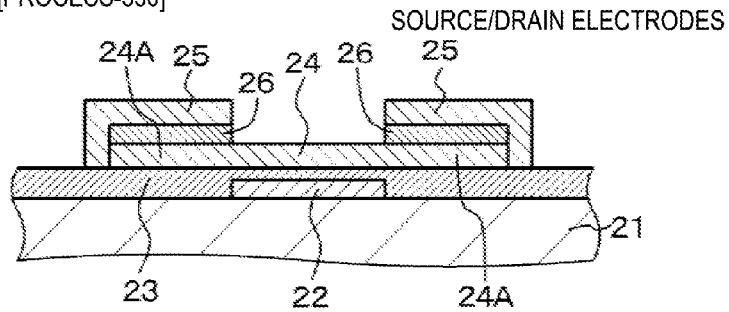

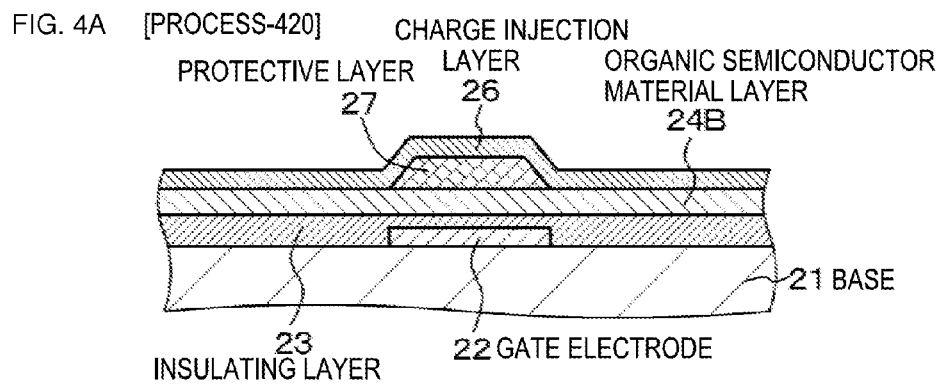
FIG. 4A [PROCESS-420]
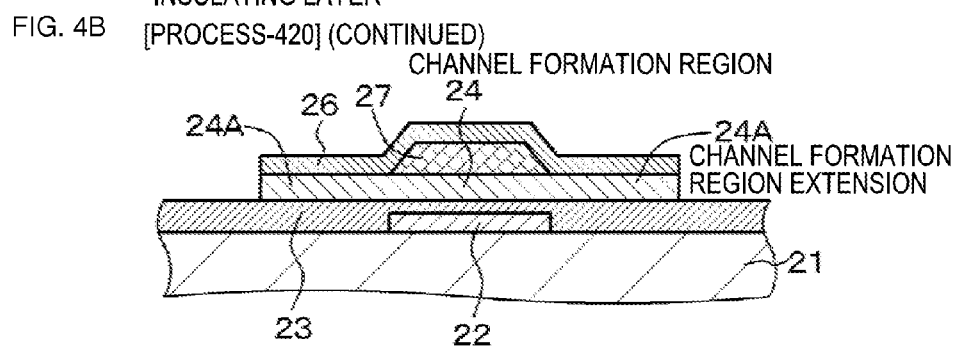
FIG. 4B [PROCESS-420] (CONTINUED)
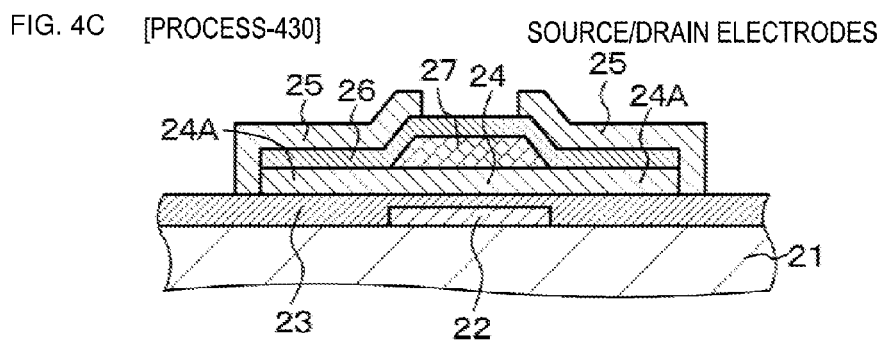
FIG. 4C [PROCESS-430]
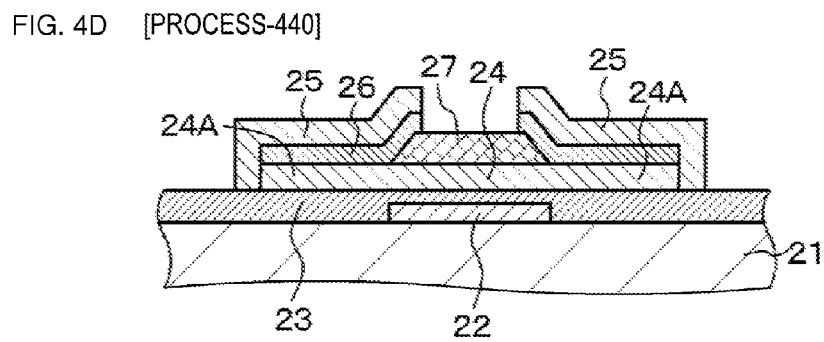
FIG. 4D [PROCESS-440]

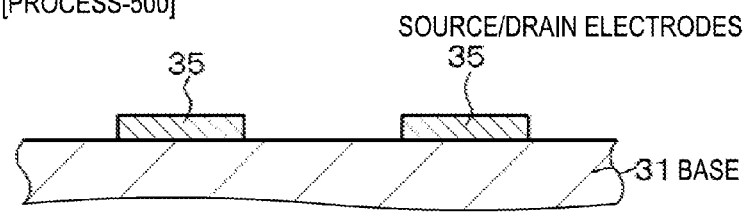
FIG. 5A [PROCESS-500]
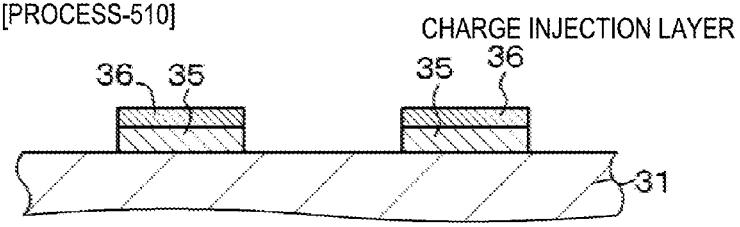
FIG. 5B [PROCESS-510]
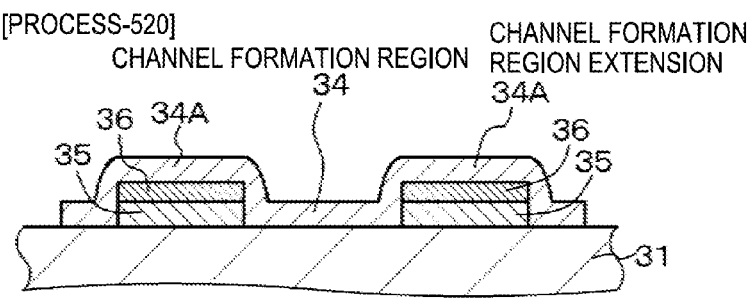
FIG. 5C [PROCESS-520]
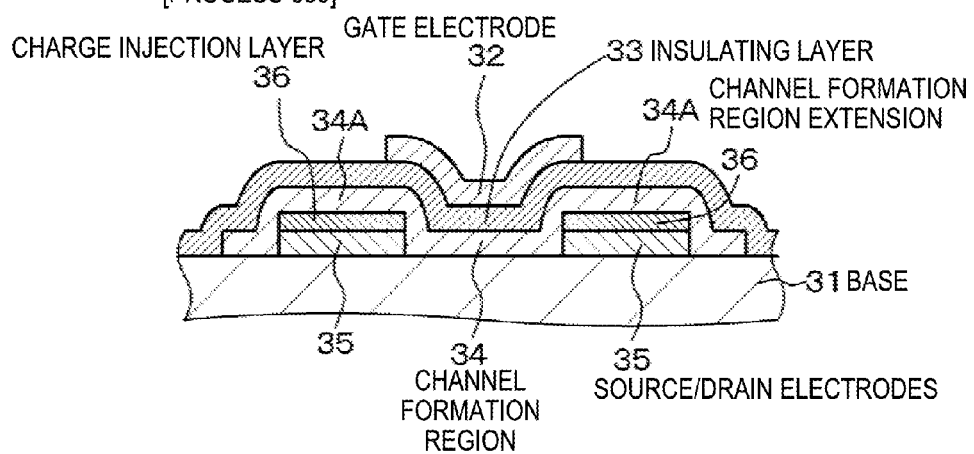
FIG. 5D [PROCESS-530]

FIG. 6A [PROCESS-600]
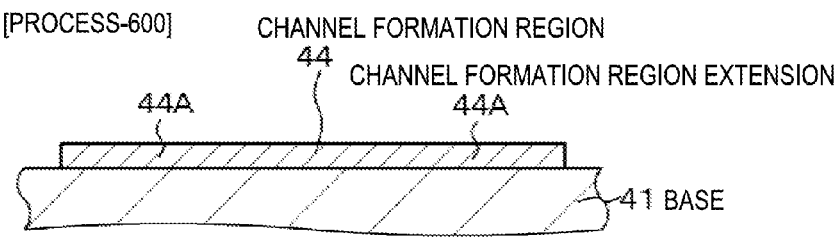
FIG. 6B [PROCESS-610]
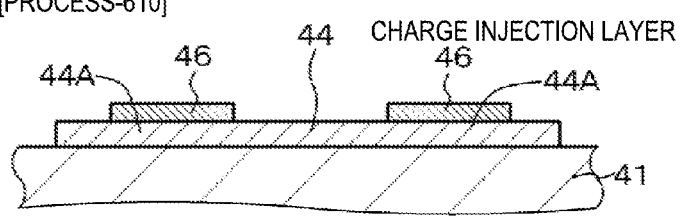
FIG. 6C [PROCESS-620]
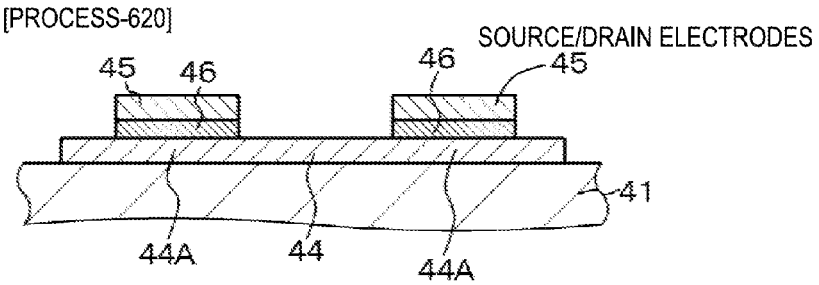
FIG. 6D [PROCESS-630]
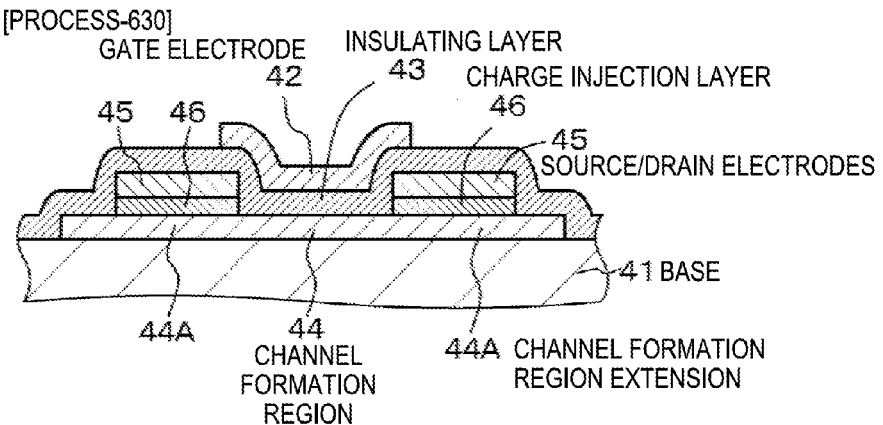

FIG. 7A [PROCESS-710]
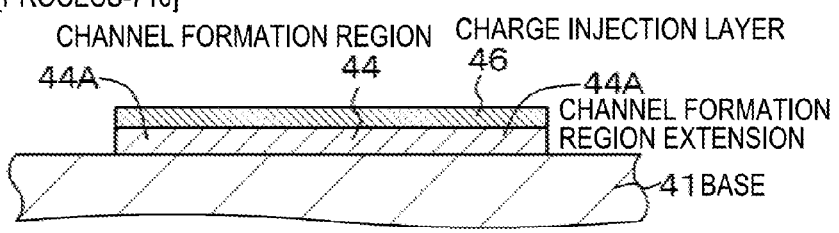
FIG. 7B [PROCESS-720]
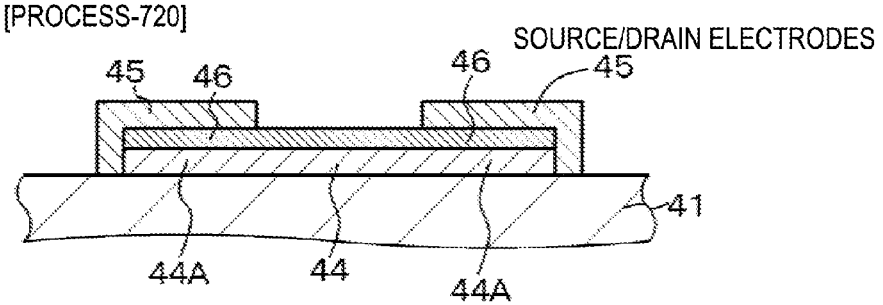
FIG. 7C [PROCESS-730]
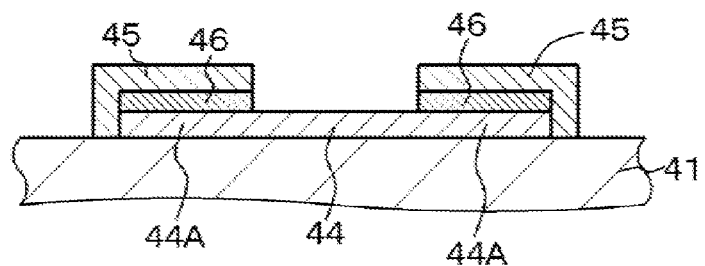

ELECTRONIC DEVICE AND METHOD OF MANUFACTURING SEMICONDUCTOR DEVICE

RELATED APPLICATION DATA

This application is a divisional of and claims the benefit under 35 U.S.C. §120 of U.S. patent application Ser. No. 13/914,968, titled "ELECTRONIC DEVICE AND METHOD OF MANUFACTURING SEMICONDUCTOR DEVICE" and filed Jun. 11, 2013, which is a divisional application of and claims the benefit under 35 U.S.C. §120 of U.S. patent application Ser. No. 13/488,835, titled "ELECTRONIC DEVICE AND METHOD OF MANUFACTURING SEMICONDUCTOR DEVICE" and filed on Jun. 5, 2012, which claims the benefit under 35 U.S.C. §119 of Japanese Patent Application JP 2011-148018, filed on Jul. 4, 2011. These applications are hereby incorporated by reference herein in their entireties.

BACKGROUND

The present disclosure relates to an electronic device and a method of manufacturing a semiconductor device.

Currently, a field effect transistor (FET) including a thin film transistor (TFT) used in a variety of electronic equipment is configured of, for example, a channel formation region and source/drain electrodes formed in a substrate such as a silicon semiconductor substrate or a silicon semiconductor material layer, a gate insulating layer including $SiO_2$ formed on a surface of the substrate, and a gate electrode disposed to face the channel formation region with the gate insulating layer. In addition, such an FET is simply referred to as a top-gate type FET. Alternatively, the FET is configured by a gate electrode disposed on a support, a gate insulating layer disposed on the support including the gate electrode and including $SiO_2$, and a channel formation region and source/drain electrodes formed on the gate insulating layer. In addition, such an FET is simply referred to as a bottom-gate type FET. A very expensive device for manufacturing a semiconductor device is used to manufacture the FET having the structure described above, and it is thus necessary to reduce the manufacturing cost.

Among these, recently, electronic devices having an active layer formed of an organic semiconductor material have been actively developed, and in particular, organic electronic devices (which may be simply referred to hereinafter as organic devices) such as organic transistors, organic light emitting elements, or organic solar cells are attracting attention. The ultimate goal of these organic devices may be to have a low cost, a light weight, flexibility, and high performance. When compared with inorganic materials of which silicon is a prime example, the organic semiconductor material (1) allows a large-sized organic device to be manufactured at a low cost at a low temperature in a simple process, (2) allows the organic device having the flexibility to be manufactured, and (3) allows performance or a physical property of the organic device to be controlled by modifying molecules constituting the organic semiconductor material to a desired form. The organic semiconductor material thus has such various advantages.

Accordingly, many materials having high performance such as high reliability as the organic semiconductor material have been developed. However, there is a typical problem that efficiency of injecting charges into the active layer from a metal material for forming electrodes such as source/drain electrodes is not so high.

In light of the foregoing problem, for example, techniques of forming a charge injection layer between source/drain electrodes and a channel formation region are disclosed in Japanese Laid-Open Patent Publication No. 2006-253675 and Japanese Laid-Open Patent Publication No. 2005-327797.

SUMMARY

However, in the technique disclosed in Japanese Laid-Open Patent Publication No. 2006-253675, the charge injection layer is formed of a material having a work function between a work function of the metal material for forming the source/drain electrodes and an ionization potential of the organic semiconductor material. That is, this technique is charge injection based on the premise of a so-called hopping conductivity. For this reason, it is difficult for the technique to be a fundamental solution for reducing a contact resistance between the source/drain electrodes and the channel formation region. In addition, in the technique disclosed in Japanese Laid-Open Patent Publication No. 2005-327797, the charge injection layer is formed of an inorganic material, but it is necessary to form a thin film with high accuracy using a plurality of raw materials. In addition, film formation equipment becomes larger, and the film formation is necessarily time-consuming.

The present disclosure thus provides an electronic device having a charge injection layer and a method of manufacturing a semiconductor device that can be formed in a short time using a simple device and that can reliably reduce a contact resistance between an electrode and an active layer.

According to first to sixth aspects of the present disclosure, there is provided an electronic device which includes at least: a first electrode; a second electrode disposed to be spaced apart from the first electrode; and an active layer disposed over the second electrode from above the first electrode and formed of an organic semiconductor material, and a charge injection layer is formed between the first electrode and the active layer and between the second electrode and the active layer. The charge injection layer is formed of an organic material having an increased electric conductivity when the charge injection layer is oxidized (electronic device according to the first aspect of the present disclosure), an oxide of a Weitz type oxidation-reduction based organic compound (electronic device according to the second aspect of the present disclosure), an oxide of an organic compound having a cyclic structure in which the number of π electrons is 4n+3 (n is a positive integer) (electronic device according to the third aspect of the present disclosure), an oxide of an organic compound having a dichalcogen five-membered ring (electronic device according to the fourth aspect of the present disclosure), an oxide of an organic compound having a monochalcogen six-membered ring (electronic device according to the fifth aspect of the present disclosure), or an oxide of at least one organic compound selected from the group including tetrathiafulvalene (TTF) and derivatives thereof, tetrathiapentalene and derivatives thereof, tetrathiatetracene, hexathiopentacene, pyranylidene and derivatives thereof, and bithiapyrinylidene (material in which oxygen O of pyranylidene is substituted with sulfur S) and derivatives thereof (electronic device according to the sixth aspect of the present disclosure).

According to the first or second aspect of the present disclosure, there is provided a method of manufacturing a semiconductor device that is a method of manufacturing a so-called bottom gate-bottom contact type semiconductor device, the method including: (A) forming a gate electrode on a base, and then forming a gate insulating layer on the base and the gate electrode; (B) forming a pair of source/drain electrodes on the gate insulating layer; and (C) forming a channel formation region formed of an organic semiconductor material on the gate insulating layer disposed between the pair of source/drain electrodes and additionally forming a channel formation region extension formed of the organic semiconductor material above each of the source/drain electrodes. The method further includes: between processes (B) and (C), forming a charge injection layer-precursor layer formed of an organic compound on each of the source/drain electrodes, and then performing oxidation on the charge injection layer-precursor layer to form a charge injection layer having a higher electric conductivity than the charge injection layer-precursor layer (method of manufacturing the semiconductor device according to the first aspect of the present disclosure), or the method further includes: between processes (B) and (C), forming a charge injection layer-precursor layer formed of an organic compound on each of the source/drain electrodes, and then performing oxidation on the charge injection layer-precursor layer to form a charge injection layer, wherein the organic compound includes at least one organic compound selected from the group including a Weitz type oxidation-reduction based organic compound, an organic compound having a cyclic structure in which the number of $\pi$ electrons is $4n+3$ (n is a positive integer), an organic compound having a dichalcogen five-membered ring, and an organic compound having a monochalcogen six-membered ring (method of manufacturing the semiconductor device according to the second aspect of the present disclosure).

According to the third or fourth aspect of the present disclosure, there is provided a method of manufacturing a semiconductor device that is a method of manufacturing a so-called bottom gate-top contact type semiconductor device, the method including: (A) forming a gate electrode on a base, and then forming a gate insulating layer on the base and the gate electrode; (B) forming a channel formation region and a channel formation region extension formed of an organic semiconductor material on the gate insulating layer; and (C) forming a pair of source/drain electrodes above the channel formation region extension. The method further includes: between processes (B) and (C), forming a charge injection layer-precursor layer formed of an organic compound on the channel formation region extension, and then performing oxidation on the charge injection layer-precursor layer to form a charge injection layer having a higher electric conductivity than the charge injection layer-precursor layer (method of manufacturing the semiconductor device according to the third aspect of the present disclosure), or the method further includes: between processes (B) and (C), forming a charge injection layer-precursor layer formed of an organic compound on the channel formation region extension, and then performing oxidation on the charge injection layer-precursor layer to form a charge injection layer, wherein the organic compound includes at least one organic compound selected from the group including a Weitz type oxidation-reduction based organic compound, an organic compound having a cyclic structure in which the number of $\pi$ electrons is $4n+3$ (n is a positive integer), an organic compound having a dichalcogen five-membered ring, and an organic compound having a monochalcogen six-membered ring (method of manufacturing the semiconductor device according to the fourth aspect of the present disclosure).

According to the fifth or sixth aspect of the present disclosure, there is provided a method of manufacturing a semiconductor device that is a method of manufacturing a so-called top gate-bottom contact type semiconductor device, the method including: (A) forming a pair of source/drain electrodes on a base; (B) forming a channel formation region formed of an organic semiconductor material between the pair of source/drain electrodes and additionally forming a channel formation region extension formed of the organic semiconductor material above each of the source/drain electrodes; and (C) forming a gate insulating layer on the channel formation region and the channel formation region extension, and then forming a gate electrode on a portion of the gate insulating layer on the channel formation region. The method further includes: between processes (A) and (B), forming a charge injection layer-precursor layer formed of an organic compound on each of the source/drain electrodes, and then performing oxidation on the charge injection layer-precursor layer to form a charge injection layer having a higher electric conductivity than the charge injection layer-precursor layer (method of manufacturing the semiconductor device according to the fifth aspect of the present disclosure), or the method further includes: between processes (A) and (B), forming a charge injection layer-precursor layer formed of an organic compound on each of the source/drain electrodes, and then performing oxidation on the charge injection layer-precursor layer to form a charge injection layer, wherein the organic compound includes at least one organic compound selected from the group including a Weitz type oxidation-reduction based organic compound, an organic compound having a cyclic structure in which the number of $\pi$ electrons is $4n+3$ (n is a positive integer), an organic compound having a dichalcogen five-membered ring, and an organic compound having a monochalcogen six-membered ring (method of manufacturing the semiconductor device according to the sixth aspect of the present disclosure).

According to the seventh or eighth aspect of the present disclosure, there is provided a method of manufacturing a semiconductor device that is a method of manufacturing a so-called top gate-top contact type semiconductor device, the method including: (A) forming a channel formation region and a channel formation region extension formed of an organic semiconductor material on a base; (B) forming a pair of source/drain electrodes above the channel formation region extension; and (C) forming a gate insulating layer on the channel formation region and the pair of source/drain electrodes, and then forming a gate electrode on a portion of the gate insulating layer on the channel formation region. The method further includes: between processes (A) and (B), forming a charge injection layer-precursor layer formed of an organic compound on the channel formation region extension, and then performing oxidation on the charge injection layer-precursor layer to form a charge injection layer having a higher electric conductivity than the charge injection layer-precursor layer (method of manufacturing the semiconductor device according to the seventh aspect of the present disclosure), or the method further includes: between processes (A) and (B), forming a charge injection layer-precursor layer formed of an organic compound on the channel formation region extension, and then performing oxidation on the charge injection layer-precursor layer to form a charge injection layer, wherein the organic compound includes at least one organic compound selected from the group including a Weitz type oxidation-reduction based organic compound, an organic compound having a cyclic structure in which the number of $\pi$ electrons is $4n+3$ (n is a positive integer), an organic compound having a dichalcogen five-membered ring, and an organic compound having a monochalcogen six-membered ring (method of manufacturing the semiconductor device according to the eighth aspect of the present disclosure).

In the electronic device according to the first to sixth aspects of the present disclosure, since the charge injection layer is formed between the first electrode and the active layer and between the second electrode and the active layer and the organic compound for forming the charge injection layer is defined, it is possible to form the charge injection layer in a short time using a simple device and to reliably reduce the contact resistance between the electrodes and the active layer. In addition, in the method of manufacturing the semiconductor device according to the first to eighth aspects of the present disclosure, since the organic compound for forming the charge injection layer is defined and oxidation can be performed on the charge injection layer-precursor layer to obtain the charge injection layer, it is possible to form the charge injection layer in a short time using a simple device.

BRIEF DESCRIPTION OF THE DRAWINGS

FIGS. 1A, 1B, 1C, and 1D are partial cross-sectional views of a base or the like schematically illustrating a method of manufacturing a semiconductor device of a first embodiment;

FIGS. 2A, 2B, 2C, and 2D are partial cross-sectional views of a base or the like schematically illustrating a method of manufacturing a semiconductor device of a second embodiment;

FIGS. 3A, 3B, 3C, and 3D are partial cross-sectional views of a base or the like schematically illustrating a method of manufacturing a semiconductor device of a third embodiment;

FIGS. 4A, 4B, 4C, and 4D are partial cross-sectional views of a base or the like schematically illustrating a method of manufacturing a semiconductor device of a fourth embodiment;

FIGS. 5A, 5B, 5C, and 5D are partial cross-sectional views of a base or the like schematically illustrating a method of manufacturing a semiconductor device of a fifth embodiment;

FIGS. 6A, 6B, 6C, and 6D are partial cross-sectional views of a base or the like schematically illustrating a method of manufacturing a semiconductor device of a sixth embodiment;

FIGS. 7A, 7B, and 7C are partial cross-sectional views of a base or the like schematically illustrating a method of manufacturing a semiconductor device of a seventh embodiment;

DETAILED DESCRIPTION OF THE EMBODIMENT(S)

Figure 8A:
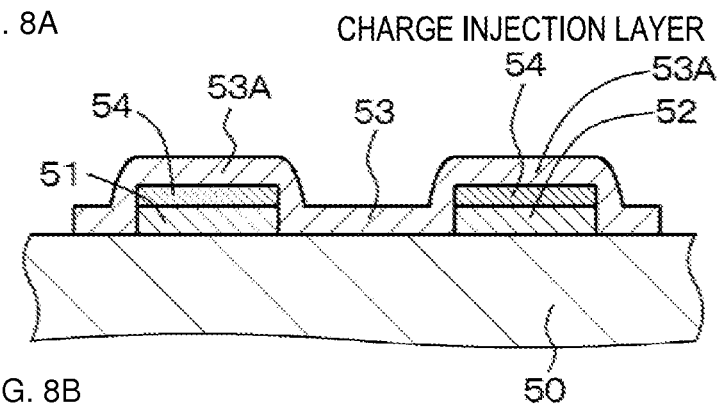
FIGS. 8A and 8B are partial cross-sectional views schematically illustrating a two-terminal type electronic device of an eighth embodiment.

Hereinafter, embodiments of the present disclosure will be described with reference to drawings, but the present disclosure is not limited to the embodiments, and various values or materials of the embodiments are merely illustrative. Further, the description will be made in the following order.

1. Electronic device according to the first to sixth aspects of the present disclosure, method of manufacturing semiconductor device according to the first to eighth aspects of the present disclosure, and general description 2. First embodiment (electronic device according to the first to sixth aspects of the present disclosure and method of manufacturing semiconductor device according to the first and second aspects of the present disclosure)

3. Second embodiment (electronic device according to the first to sixth aspects of the present disclosure and method of manufacturing semiconductor device according to the third and fourth aspects of the present disclosure)

4. Third embodiment (modification of the second embodiment)

5. Fourth embodiment (another modification of the second embodiment)

6. Fifth embodiment (electronic device according to the first to sixth aspects of the present disclosure and method of manufacturing semiconductor device according to the fifth and sixth aspects of the present disclosure)

7. Sixth embodiment (electronic device according to the first to sixth aspects of the present disclosure and method of manufacturing semiconductor device according to the seventh and eighth aspects of the present disclosure)

8. Seventh embodiment (modification of the sixth embodiment)

9. Eighth embodiment (modification of the fifth or sixth embodiment), etc.

[Electronic Device According to the First to Sixth Aspects of the Present Disclosure, Method of Manufacturing Semiconductor Device According to the First to Eighth Aspects of the Present Disclosure, and General Description]

In the method of manufacturing a semiconductor device according to the first to eighth aspects of the present disclosure, oxidation performed on a charge injection layer-precursor layer may be in the form of natural oxidation (including heat-treating the charge injection layer-precursor layer) under an air atmosphere, or may be in the form of oxidation (including heat-treating the charge injection layer-precursor layer) under an oxygen gas atmosphere (or under an oxidation atmosphere).

The electronic device of the present disclosure may have a so-called three-terminal structure or a two-terminal structure. In the former case, the electronic device further includes an insulating layer, and a control electrode disposed to face a portion of an active layer located between the first and second electrodes via the insulating layer. For example, the electronic device having the three-terminal structure includes a field effect transistor (FET), in particular, a thin film transistor (TFT), or a light emitting element. That is, the light emitting element (organic light emitting element and organic light emitting transistor) may include the active layer that emits light by means of voltage applied to the control electrode and the first and second electrodes. In these electronic devices, a current flowing in the active layer from the first electrode toward the second electrode is controlled by the voltage applied to the control electrode. Here, in the light emitting element, an organic semiconductor material for forming the active layer has a function of accumulating charges by means of modulation based on the voltage applied to the control electrode or a function of emitting light on the basis of recombination between injected electrons and positive holes (holes), and the emission intensity is in proportion to an absolute value of the current flowing from the first electrode toward the second electrode, and can be modulated by the voltage applied to the control electrode and the voltage applied between the first and second electrodes. In addition, whether the electronic device fulfills a function as the FET or acts as the light emitting element depends on a state (bias) of the voltage applied to the first and second electrodes. First, the bias in a range that does not cause electrons to be injected from the second electrode is applied and then the control electrode is modulated, thereby causing the current to flow from the first electrode toward the second electrode. This is the transistor operation. On the other hand, when holes are sufficiently accumulated and then the bias applied to the first and second electrodes is increased, electrons start to be injected, thereby causing the electrons to be recombined with the holes to emit light. In addition, as the electronic device having the two-terminal structure, a photoelectric conversion element in which the current flows between the first and second electrodes by means of light irradiation toward the active layer may be employed. In particular, when the electronic device includes a photoelectric conversion element, the photoelectric conversion element may include a solar cell or an image sensor. In addition, the electronic device having the three-terminal structure may also include the photoelectric conversion element. In this case, the voltage may not be applied or may be applied to the control electrode. In the latter case, the voltage applied to the control electrode allows the flowing current to be modulated.

In the electronic device according to the first to sixth aspects of the present disclosure including the preferred forms and configurations described above, the electronic device may be a bottom gate-bottom contact type TFT, a bottom gate-top contact type TFT, a top gate-bottom contact type TFT, or a top gate-top contact type TFT.

In particular, when the electronic device according to the first to sixth aspects of the present disclosure is the bottom gate-bottom contact type TFT having the three-terminal structure, the control electrode is formed on the base as a gate electrode, the insulating layer is formed on the gate electrode and the base as a gate insulating layer, the first and second electrodes are formed on the gate insulating layer as a pair of source/drain electrodes, the active layer is formed on the gate insulating layer between the pair of source/drain electrodes as a channel formation region and formed above the source/drain electrodes as a channel formation region extension, and a charge injection layer is formed between each of the source/drain electrodes and the channel formation region extension.

In addition, when the electronic device according to the first to sixth aspects of the present disclosure is the bottom gate-top contact type TFT having the three-terminal structure, the control electrode is formed on the base as a gate electrode, the insulating layer is formed on the gate electrode and the base as a gate insulating layer, the active layer is formed on the gate insulating layer as a channel formation region and a channel formation region extension, the first and second electrodes are formed above the channel formation region extension as a pair of source/drain electrodes, and a charge injection layer is formed between each of the source/drain electrodes and the channel formation region extension.

In addition, when the electronic device according to the first to sixth aspects of the present disclosure is the top gate-bottom contact type TFT having the three-terminal structure, the first and second electrodes are formed on the base as a pair of source/drain electrodes, the active layer is formed on the base between the pair of source/drain electrodes as a channel formation region and is formed above the source/drain electrodes as a channel formation region extension, the insulating layer is formed on the channel formation region and the channel formation region extension as a gate insulating layer, the control electrode is formed on the gate insulating layer to face the channel formation region as a gate electrode, and a charge injection layer is formed between each of the source/drain electrodes and the channel formation region extension.

In addition, when the electronic device according to the first to sixth aspects of the present disclosure is the top gate-top contact type TFT having the three-terminal structure, the active layer is formed on the base as a channel formation region and a channel formation region extension, the first and second electrodes are formed above the channel formation region extension as a pair of source/drain electrodes, the insulating layer is formed on the pair of source/drain electrodes and the channel formation region as a gate insulating layer, the control electrode is formed on the gate insulating layer as a gate electrode, and a charge injection layer is formed between each of the source/drain electrodes and the channel formation region extension.

In the electronic device according to the sixth aspect of the present disclosure, the charge injection layer includes at least one oxide of an organic compound selected from the group including tetrathiafulvalene and derivatives thereof, tetrathiapentalene and derivatives thereof, tetrathiatetracene, hexathiopentacene, pyranylidene and derivatives thereof, and bithiapyrinylidene and derivatives thereof. Here, as the derivatives of tetrathiafulvalene (TTF), in particular, MDT-TTF, TMSF, BMDT-TTF, BEDO-TTF, BEDT-TTF, DMB EDT-TTF, TM-TTF, BEDT-TSF, DMET, and so forth may be employed. As the derivative of tetrathiapentalene, in particular, TTM-TTP, BEDT-TTP, CnTTM-TTP, and so forth may be employed. As the derivatives of tetrathiapentalene, in particular, dithiapyranylidene or the like may be employed. In addition, the organic compound for forming the charge injection layer of the electronic device according to the sixth aspect of the present disclosure may be employed as a specific example of a Weitz type oxidation-reduction based organic compound of the electronic device according to the second aspect of the present disclosure. In addition, the organic compound for forming the charge injection layer of the electronic device according to the sixth aspect of the present disclosure may be employed as a specific example of an organic compound having a cyclic structure in which a number of $\pi$ electrons is $4n+3$ (n is a positive integer) in the electronic device according to the third aspect of the present disclosure. In addition, TTF and derivatives thereof, tetrathiapentalene and derivatives thereof, tetrathiatetracene, and hexathiopentacene may be employed as specific examples of organic compounds having dichalcogen five-membered rings of the electronic device according to the fourth aspect of the present disclosure. In addition, pyranylidene and derivatives thereof, and bithiapyrinylidene and derivatives thereof may be employed as specific examples of organic compounds having monochalcogen six-membered rings of the electronic device according to the fifth aspect of the present disclosure.

As a method of forming the charge injection layer-precursor layer, a coating method may be employed. Here, as the coating method, various printing methods such as a screen printing method, an inkjet printing method, an offset printing method, a reverse offset printing method, a gravure printing method, a gravure offset printing method, a relief printing method, a flexo printing method, a microcontact method; a spin coating method; various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit coater method, a slit orifice coater method, a calender coater method, a casting method, a capillary coater method, a bar coater method, a dipping method; a spray method; a method using a dispenser; and a method of coating a liquid material such as a stamp method may be employed. In addition, the method of forming the charge injection layer-precursor layer is not limited to the coating methods but may employ physical vapor deposition (PVD) methods such as resistive heating evaporation methods, sputtering methods, or vacuum evaporation methods. For example, the charge injection layer-precursor layer or the charge injection layer may be formed on the basis of well-known methods such as a wet etching method, a dry etching method, or a laser ablation method as necessary.

In the electronic device according to the first aspect of the present disclosure and the method of manufacturing the semiconductor device according to the first, third, fifth and seventh aspects of the present disclosure, as a relation between the value $\sigma_1$ of the electric conductivity (also referred to as electrical conductivity or conductivity) of the organic compound for forming the charge injection layer-precursor layer and the value $\sigma_2$ of the electric conductivity of the organic compound for forming the charge injection layer obtained by performing oxidation on the charge injection layer-precursor layer, for example, $\sigma_2/\sigma_1 \geq 100/1$ may be employed. The electric conductivity may be measured on the basis of methods such as IV measurement on two terminals or sheet resistance measurement on four terminals.

In the electronic device according to the first to sixth aspects of the present disclosure and the method of manufacturing the semiconductor device according to the first to eighth aspects of the present disclosure including various preferred embodiments and configurations described above (these may be simply referred to as the present disclosure), as the organic semiconductor material, for example, polypyrrole and substitutes of polypyrrole, polythiophene and derivatives of polythiophene, isothianaphthenes such as polyisothianaphthene, thienylenevinylenes such as poly thienylenevinylene, types of poly(p-phenylenevinylene) such as poly(p-phenylenevinyene), polyaniline and derivatives of polyaniline, polyacetylene, polydiacetylene, polyazulene, polypyrene, polycarbazole, polyselenophene, polyfuran, poly(p-phenylene), polyindole, polypyridazine, naphthacene, pentacene[2,3,6,7-dibenzanthracene], hexacene, heptacene, dibenzopentacene, tetrabenzopentacene, pyrene, benzopyrene, dibenzopyrene, chrysene, perylene, coronene, terylene, ovalene, quaterrylene, acenes such as circumanthracene, and derivatives in which some carbon atoms of an acene are substituted with atoms such as N, S, or O, or a functional group such as a carbonyl group (dioxaanthanthrene based compounds including perixanthenoxanthene and derivatives of perixanthenoxanthene, triphenoldioxazine, triphenoldithiazine, hexacene-6,15-quinone), polymers such as polyvinylcarbazole, polyphenylene sulfide, or polyvinylene sulfide, or polycyclic condensation products may be employed. Alternatively, oligomers having these polymers as repeating units may be employed. In addition, metal phthalocyanines represented by copper phthalocyanine, naphthalene 1,4,5,8-tetracarboxylic acid diimide, N,N-bis(4-trifluoromethylbenzyl)naphthalene 1,4,5,8-tetracarboxylic acid diimide, N,N'-bis(1H,1H-perfluorooctyl), N,N'-bis(1H,1H-perfluorobutyl), N,N'-dioctylnaphthanlene 1,4,5,8-tetracarboxylic acid diimide derivatives, naphthalene tetracarboxylic acid diimides such as naphthalene 2,3,6,7 tetracarboxylic acid diimide, condensed ring tetracarboxylic acid diimides such as anthracene tetracarboxylic acid diimide such as anthracene 2,3,6,7-tetracarboxylic acid diimide, fullerenes such as C60, C70, C76, C78, or C84, carbon nanotubes such as SWNT, or pigments such as merocyanine pigment or hemicyanine pigment may be employed. Alternatively, as the organic semiconductor material, poly-3-hexylthiophene [P3HT] in which a hexyl group is introduced into polythiophene, polyanthracene, triphenylene, polytellurophene, polynaphthalene, polyethylenedioxythiophene, poly(3,4-ethylenedioxythiophene)/polystyrene sulfonic acid [PEDOT/PSS], or quinacridone may be employed. Alternatively, as the organic semiconductor material, compounds selected from the group including condensed polycyclic aromatic compounds, porphyrin based derivatives, phenylvinylidene based conjugated oligomers, and thiophene based conjugated oligomers may be employed. In particular, for example, condensed polycyclic aromatic compounds such as acene-based molecules (pentacene, tetracene, and so forth), porphyrin based molecules, and (phenylvinylidene based or thiophene based) conjugated oligomers may be employed. Alternatively, as the organic semiconductor material, for example, porphyrin, 4,4'-biphenyldithiol (BPDT), 4,4'-diisocyanobiphenyl, 4,4'-diisocyano-p-terphenyl, 2,5-bis(5'-thioacetyl-2'-thiophenyl)thiophene, 2,5-bis(5'-thioacetoxyl-2'-thiophenyl)thiophene, 4,4'-diisocyanophenyl, benzidine(biphenyl-4,4'-diamine), tetracyanoquinodimethane (TCNQ), TTF-TCNQ complex, bisethylenetetrathiafulvalene (BEDTTTF)-perchloric acid complex, BEDTTTF-iodine complex, charge transfer complexes represented by TCNQ-iodine complex, biphenyl-4,4'-dicarboxylic acid, 1,4-di(4-thiophenylacetylenyl)-2-ethylbenzene, 1,4-di(4-isocyanophenylacetylenyl)-2-ethylbenzene, dendrimer, 1,4-di(4-thiophenylacetylenyl)-2-ethylbenzene, 2,2"-dihydroxy-1,1':4',1"-terphenyl, 4,4'-biphenyldiethanal, 4,4'-biphenyldiol, 4,4'-biphenyldiisocyanate, 1,4-diacetylbenzene, diethylbiphenyl-4,4'-dicarboxylate, benzo[1,2-c;3,4-c';5,6-c"]tris[1,2]dithiol-1,4,7-trithione, alpha-sexithiophene, tetrathiotetracene, tetraselenotetracene, tetratellurotetracene, poly(-alkylthiophene), poly(3-thiophene-β-ethanesulfonic acid), poly(N-alkylpyrrole)poly(3-alkylpyrrole), poly(3,4-dialkylpyrrole), poly(2,2'-thienylpyrrole), or poly(dibenzothiophene sulphide) may be employed.

In addition, as a preferred combination (of the organic semiconductor material and the material for forming the charge injection layer-precursor layer), a derivative of perixanthenoxanthene and a derivative of TTF, pentacene and a derivative of TTF, and so forth may be employed.

A polymer may be included in the active layer, the channel formation region, or the channel formation region extension (organic semiconductor material layer) as necessary. The polymer may be dissolved in an organic solvent. In particular, as the polymer (organic binder, binder), polystyrene, polyalphamethylstyrene, or polyolefin may be employed. In addition, in some cases, an additive (e.g., a so-called doping material such as n-type impurities or p-type impurities) may be added.

As a solvent for preparing the organic semiconductor material solution, aromatics such as toluene, xylene, mesitylene, and tetralin; ketones such as cyclopentanone, and cyclohexanone; and hydrocarbons such as decalin may be employed. Above all, it is preferable that solvents having a relatively high boiling point such as mesitylene, tetralin, and decalin be used in terms of transistor characteristics and also in terms of preventing the organic semiconductor material from being rapidly dried at the time of forming the organic semiconductor material layer.

As a method of forming the active layer or the channel formation region and the channel formation region extension, a coating method may be employed. However, the present disclosure is not limited thereto but may employ various PVD methods or CVD methods to form the active layer or the channel formation region and the channel formation region extension. Here, the coating method may be any of general coating methods without problem. In particular, for example, the various coating methods described above may be employed. The channel formation region and the channel formation region extension may be patterned on the basis of well-known methods such as a wet etching method or a dry etching method and a laser ablation method as necessary. In addition, when the charge injection layer-precursor layer is formed on the channel formation region extension, a protective layer may be formed on the channel formation region and the charge injection layer-precursor layer may then be formed on the channel formation region extension and the protective layer as necessary. In addition, although the charge injection layer-precursor layer on the protective layer or the charge injection layer is removed in the end, the protective layer is present when the charge injection layer-precursor layer or the charge injection layer is removed, and it is thus possible to reliably prevent the channel formation region from being damaged.

As a material for forming the control electrode, the first electrode, the second electrode, the gate electrode, or the source/drain electrodes, metals such as platinum (Pt), gold (Au), palladium (Pd), chromium (Cr), molybdenum (Mo), nickel (Ni), aluminum (Al), silver (Ag), tantalum (Ta), tungsten (W), copper (Cu), titanium (Ti), indium (In), tin (Sn), iron (Fe), cobalt (Co), zinc (Zn), magnesium (Mg), manganese (Mn), ruthenium (Rh), or rubidium (Rb), or alloys including these metallic elements, conductive particles including these metals, conductive particles of alloys including these metals, or conductive materials such as polysilicon containing impurities may be employed, and a stacked structure of layers including these elements may also be employed. In addition, as a material for forming the control electrode, the first electrode, the second electrode, the gate electrode, or the source/drain electrodes, organic materials (conductive high molecules) such as PEDOT/PSS, TTF-TCNQ, or polyaniline may be employed. The material for forming the control electrode, the first electrode, the second electrode, the gate electrode, or the source/drain electrodes may be the same material or different materials.

As a method of forming the control electrode, the first electrode, the second electrode, the gate electrode, or the source/drain electrodes, although also depending on the material for forming these electrodes, any one of the coating methods listed above, a physical vapor deposition (PVD) method, a pulse laser deposition (PLD) method, an arc discharge method, various chemical vapor deposition (CVD) methods including metal organic CVD (MOCVD), a lift off method, a shadow mask method, and a plating method such as an electrolytic plating method, a non-electrolytic plating method or a combination of the electrolytic plating method and the non-electrolytic plating method, and a patterning technique may be combined as necessary. In addition, as the PVD method, (a) various vacuum evaporation methods such as an electron beam heating method, a resistance heating method, a flash evaporation method, and a method of heating a crucible, (b) a plasma deposition method, (c) various sputtering methods such as a dipole sputtering method, a direct current sputtering method, a direct current magnetron sputtering method, a high-frequency sputtering method, a magnetron sputtering method, an ion beam sputtering method, and a bias sputtering method, (d) a direct current (DC) method, a radio frequency (RF) method, a multi cathode method, an activation reaction method, an electric field deposition method, and various ion plating methods such as a high frequency ion plating method and a reactive ion plating method may be employed. When a resist pattern is formed, for example, a resist material is coated to form a resist layer, and a photolithography technique, a laser lithography technique, an electron beam lithography technique, or an X-beam lithography technique is then used to pattern the resist layer. A resist transfer method or the like may be used to form the resist pattern. When the control electrode, the first electrode, the second electrode, the gate electrode, or the source/drain electrodes are formed on the basis of an etching method, a dry etching method or a wet etching method may be employed, and ion milling or RIE may be employed as the dry etching method, for example. In addition, the control electrode, the first electrode, the second electrode, the gate electrode, or the source/drain electrodes may be formed on the basis of a laser ablation method, a mask deposition method, a laser transfer method, and so forth.

The insulating layer or the gate insulating layer (hereinafter, these may be collectively referred to as a gate insulating layer or the like) may be single-layered or multi-layered. As a material for forming the gate insulating layer or the like, not only an inorganic insulating material illustrated by a silicon oxide based material, a silicon nitride ($SiN_Y$), and a metal oxide high-k insulating film such as aluminum oxide ($Al_2O_3$) or $HfO_2$ but also an organic insulating material (organic polymer) illustrated by polymethylmethacrylate (PMMA), polyvinylphenol (PVP), polyvinyl alcohol (PVA), polyimide, polycarbonate (PC), polyethylene terephthalate (PET), polystyrene, N-2(aminoethyl) 3-aminopropyl trimethoxysilane (AEAPTMS), 3-mercaptopropyl trimethoxysilane (MPTMS), a silanol derivative such as octadecyl trichlorosilane (OTS) (a silane coupling agent), octadecanethiol, and a straight chain hydrocarbon having a functional group capable of being coupled with the control electrode or the gate electrode at one terminal of dodecyl isocyanate may be employed, and a combination thereof may also be used. Here, as the silicon oxide based material, a silicon oxide ($SiO_X$), BPSG, PSG, BSG, AsSG, PbSG, silicon oxynitride (SiON), a spin-on-glass (SOG), and a low-k $SiO_2$ based material (e.g., polyarylether, cycloperfluorocarbon polymer and benzo cyclobutene, cyclic fluorine resin, polytetrafluoroethylene, arylether fluoride, polyimide fluoride, amorphous carbon, and organic SOG) may be employed.

As a method of forming the gate insulating layer or the like, besides the coating methods listed above, a combination of any one of a lift off method, a sol-gel method, an electrodeposition method and a shadow mask method, and a patterning technique may be employed as necessary.

Alternatively, the gate insulating layer may be formed by performing oxidation or nitridation on the surface of the control electrode or the gate electrode or by forming an oxide film or a nitride film on the surface of the control electrode or the gate electrode. As the method of performing oxidation on the surface of the control electrode or the gate electrode, although also depending on the material for forming the control electrode or the gate electrode, an oxidation method using $O_2$ plasma and an anodization method may be employed. In addition, as the method of performing nitridation on the surface of the control electrode or the gate electrode, although also depending on the material for forming the control electrode or the gate electrode, a nitridation method using $N_2$ plasma may be employed. Alternatively, for example, for the Au electrode, the surface of the control electrode or the gate electrode is covered by a dipping method or the like in a self-organizing way with insulating molecules having a functional group capable of being chemically coupled with the control electrode or the gate electrode such as straight-chain hydrocarbon of which one terminal is modified with the mercapto group, and it is thus possible to form the gate insulating layer on the surface of the control electrode or the gate electrode. Alternatively, the gate insulating layer may be formed by modifying the surface of the control electrode or the gate electrode with a silanol derivative (silane coupling agent).

In the present disclosure, the base may include a silicon oxide based material (e.g., $SiO_X$ or SOG), a silicon nitride ($SiN_Y$), and a metal oxide high-k insulating film such as aluminum oxide ($Al_2O_3$) or $HfO_2$. When the base is formed of these materials, the base may be formed on a support (or above the support) properly selected from materials listed below. That is, as the support or a base other than the base described above, a plastic film, a plastic sheet, or a plastic substrate having flexibility including an organic polymer illustrated by polymethyl methacrylate (polymethacrylic acid methyl (PMMA)) or PVA, PVP, polyether sulfone (PES), polyimide, PC, PET, polyethylene naphthalate (PEN), or mica may be employed. For example, when the base formed of the high-molecular material such as the organic polymer having flexibility is used, it is possible to assemble an electronic device or a semiconductor device with a display device or electronic equipment having a curved surface shape. Alternatively, as the base, various glass substrates, various glass substrates having an insulating film formed on a surface thereof, a quartz substrate, a quartz substrate having an insulating film formed on a surface thereof, a silicon substrate having an insulating film formed on a surface thereof, a sapphire substrate, a metallic substrate formed of various alloys such as stainless steel or various metals may be employed. For the support having an electrically insulating property, any material listed above may be properly selected. Also, as the support, a conductive substrate (a substrate formed of a metal such as gold or aluminum, a substrate formed of high-orientation graphite, or a stainless steel substrate) may be employed. In addition, depending on the configuration and structure of the semiconductor device, the semiconductor device may be formed on the support. However, the support may also be formed of the material listed above.

The present disclosure may be applied to an image display device or a method of manufacturing the image display device, for example. Here, as the image display device, various image display devices such as so-called desktop-type personal computers, notebook-type personal computers, mobile-type personal computers, personal digital assistants (PDAs), cellular phones, gaming machines, electronic books, electronic papers such as electronic newspapers, signboards, posters, bulletin boards such as black boards, copying machines, rewritable papers replacing printer papers, electronic calculators, display portions of home appliances, card display portions of point cards or the like, electronic advertisements, electronic POPs, and so forth may be employed. In addition, various illumination devices may also be employed.

When the electronic device or the semiconductor device of the present disclosure is applied to display devices or a variety of electronic equipment and used, it may be used as a monolithic integrated circuit in which the support is integrated with a number of semiconductor devices, and may also be used as a discrete part after the electronic devices of the semiconductor devices are individually diced. In addition, the electronic device or the semiconductor device may be sealed with a resin.

First Embodiment

The first embodiment relates to an electronic device according to the first to sixth aspects of the present disclosure, and in particular, relates to a bottom gate-bottom contact type TFT having a three-terminal structure and a method of manufacturing a semiconductor device according to the first and second aspects of the present disclosure.

The electronic device of the first embodiment or the second to eighth embodiments includes at least a first electrode, a second electrode disposed to be spaced apart from the first electrode, and an active layer disposed over a second electrode from above the first electrode and formed of an organic semiconductor material, and a charge injection layer is disposed between the first electrode and the active layer and between the second electrode and the active layer.

Here, in the bottom gate-bottom contact type TFT having the three-terminal structure of the first embodiment, as shown in FIG. 1D schematically illustrating a partial cross-sectional view, a gate electrode 12 is formed on a base 11 as a control electrode, a gate insulating layer 13 is formed on the gate electrode 12 and the base 11 as an insulating layer, a pair of source/drain electrodes 15 are formed on the gate insulating layer 13 as first and second electrodes, a channel formation region 14 formed on the gate insulating layer 13 between the pair of source/drain electrodes 15 and a channel formation region extension 14A formed above the source/drain electrodes 15 are formed as an active layer, and a charge injection layer 16 is formed between each of the source/drain electrodes 15 and the channel formation region extension 14A.

Here, the base 11 is formed of a silicon substrate, the gate electrode 12 (control electrode) is formed of gold (Au), the gate insulating layer 13 (insulating layer) is formed of $SiO_2$, the source/drain electrodes 15 (first and second electrodes) are formed of gold (Au), and the channel formation region 14 and the channel formation region extension 14A (active layer) are formed of pentacene. This is also applied to the second to eighth embodiments to be described later in the same way.

In addition, in the first embodiment, the charge injection layer 16 is formed of an organic material having an increased electric conductivity when the charge injection layer is oxidized. In addition, when the value of the electric conductivity (electrical conductivity, conductivity) of an organic compound for forming a charge injection layer-precursor layer is denoted with $\sigma_1$ and the value of the electric conductivity of the organic compound for forming the charge injection layer obtained by performing oxidation on the charge injection layer-precursor layer is denoted with $\sigma_2$, $\sigma_2/\sigma_1$ equals to $0.0652\ \Omega^{-1}\cdot m^{-1}/1\times 10^{-5}\ \Omega^{-1}\cdot m^{-1}=6000$. Alternatively, the charge injection layer 16 is formed of an oxide of a Weitz type oxidation-reduction based organic compound (oxidation-reduction based organic compound that generates a six-$\pi$ system at a terminal of a molecular structure in an oxidized state). Alternatively, the charge injection layer 16 is formed of an oxide of an organic compound having a cyclic structure in which the number of π electrons is 4n+3 (n is a positive integer). Alternatively, the charge injection layer 16 is formed of an oxide of an organic compound having a dichalcogen five-membered ring. Alternatively, the charge injection layer 16 is formed of an oxide of TTF. This is also applied to the second to eighth embodiments to be described later in the same way. Here, the Weitz type oxidation-reduction based organic compound or the cyclic material having 4n+3π electrons generates 6π systems by pulling out one electron (i.e., by performing oxidation), or is easily oxidized in the air because it forms a stable aromatic ring having 4n+2π electrons. That is, the compound is disposed in the air, and holes are spontaneously doped, thereby enhancing the electric conductivity. Such an organic compound is disposed at an interface between the electrode and the organic semiconductor material, and it is thus possible to easily introduce a doping layer for charge injection with good controllability. As a result, high performance and high reliability device by suppressing element degradation due to degradation of a contact portion can be achieved in the electronic device or the semiconductor.

Hereinafter, a method of manufacturing the semiconductor device of the first embodiment will be described with reference to FIGS. 1A to 1D schematically illustrating partial cross-sectional views of a base or the like.

[Process-100]

First, the gate electrode 12 is formed on the base 11. In particular, a pattern for forming the gate electrode based on a resist layer is formed on the base 11. A Ti layer as an adhesive layer and an Au layer as the gate electrode 12 are then sequentially formed on the base 11 and the resist layer by a vacuum evaporation method. The adhesive layer is not shown in the drawings. When the evaporation is performed, the base 11 is carried on a base holder (not shown) that can adjust the temperature and suppress the increase in base temperature during the evaporation, and it is thus possible to perform film formation in which deformation of the base 11 is suppressed as much as possible. The resist layer is then removed by a lift-off method, and it is thus possible to obtain the gate electrode 12 formed of the Au layer.

[Process-110]

Next, the gate insulating layer 13 is formed on the base 11 and the gate electrode 12. That is, the gate insulating layer 13 is formed over an entire surface of the obtained structure. In particular, the gate insulating layer 13 formed of $SiO_2$ is formed on the gate electrode 12 and the base 11 on the basis of a sputtering method (see FIG. 1A). When formation of the gate insulating layer 13 is performed, a portion of the gate electrode 12 is covered by a hard mask, and it is thus possible to form an extraction portion of the gate electrode 12 (not shown) without a photolithography process.

[Process-120]

Next, a pair of source/drain electrodes 15 is formed on the gate insulating layer 13. In particular, a titanium (Ti) layer (not shown) having a thickness of about 0.5 nm as an adhesive layer and a gold (Au) layer having a thickness of about 25 nm as the source/drain electrodes 15 are sequentially formed on the basis of a vacuum evaporation method. When these layers are formed, a portion of the gate insulating layer 13 is covered by a hard mask, and it is thus possible to form the source/drain electrodes 15 without a photolithography process.

[Process-130]

Figure 9:
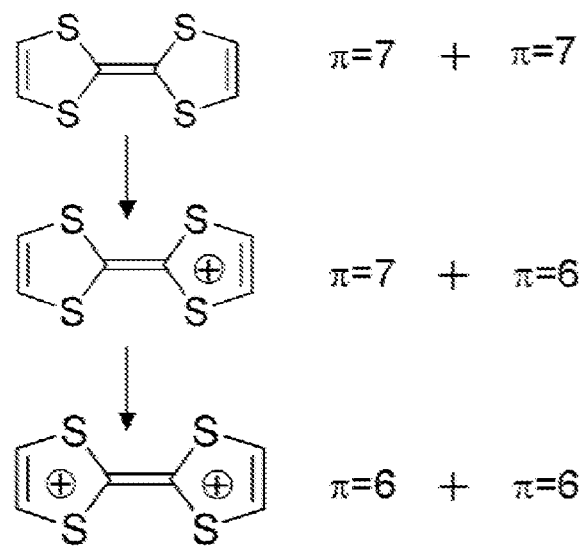
FIG. 9 is a diagram illustrating a state in which tetrathiafulvalene (TTF) is oxidized.

Next, a charge injection layer-precursor layer formed of an organic compound is formed on each of the source/drain electrodes 15 on the basis of an inkjet printing method. In addition, as described above, the organic compound includes the Weitz type oxidation-reduction based organic compound, the organic compound having a cyclic structure in which the number of π electrons is 4n+3 (n is a positive integer), the organic compound having the dichalcogen five-membered ring, or an organic compound having a monochalcogen six-membered ring to be described later. Oxidation is then performed on the charge injection layer-precursor layer, thereby obtaining the charge injection layer 16 having a thickness of 5 nm (see FIG. 1C). The charge injection layer 16 is formed only on top surfaces of the source/drain electrodes 15 in the drawing. However, the charge injection layer 16 is not formed only on the top surfaces of the source/drain electrodes 15 but may also be formed on side surfaces of the source/drain electrodes 15. This also applies to the embodiments to be described below in the same way. The oxidation performed on the charge injection layer-precursor layer is natural oxidation under an air atmosphere, but is not limited thereto. The oxidation (including heating on the charge injection layer-precursor layer) may be performed under an oxygen gas atmosphere (or under an oxidation atmosphere). In particular, the oxidation was performed in conditions of air atmosphere, 60° C., and 30 minutes. In this way, TTF is oxidized as shown in FIG. 9.

[Process-140]

Next, a channel formation region 14 formed of an organic semiconductor material is formed on the gate insulating layer 13 located between the pair of source/drain electrodes 15, and a channel formation region extension 14A formed of the organic semiconductor material is also formed above each of the source/drain electrodes 15, in particular, on the charge injection layer 16 (see FIG. 1D). In particular, an organic semiconductor material layer is formed on an entire surface of the obtained structure on the basis of a spin coating method and then dried. The organic semiconductor material layer is then patterned as necessary, and it is thus possible to obtain the channel formation region 14 and the channel formation region extension 14A.

For example, in the method of manufacturing an image display device, subsequent to this process, an image display portion (in particular, for example, an image display portion including an organic electroluminescence element, an electrophoretic display element, or a semiconductor light emitting element) may be formed on or above the semiconductor device on the basis of well-known methods. Also, in each of the embodiments to be described below, the same processes may be performed after completion of manufacturing of the electronic device or the semiconductor device, thereby obtaining the image display portion.

Figure 10:
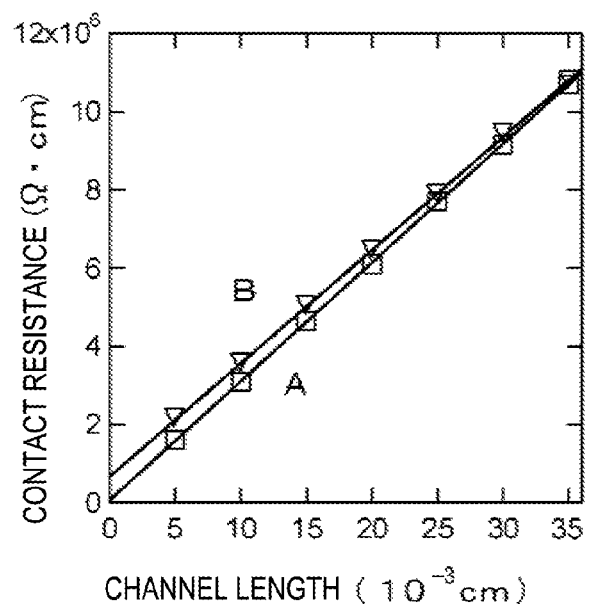
FIG. 10 is a graph illustrating a result of measuring values of contact resistances in the first embodiment and a comparative example.
Figure 11:
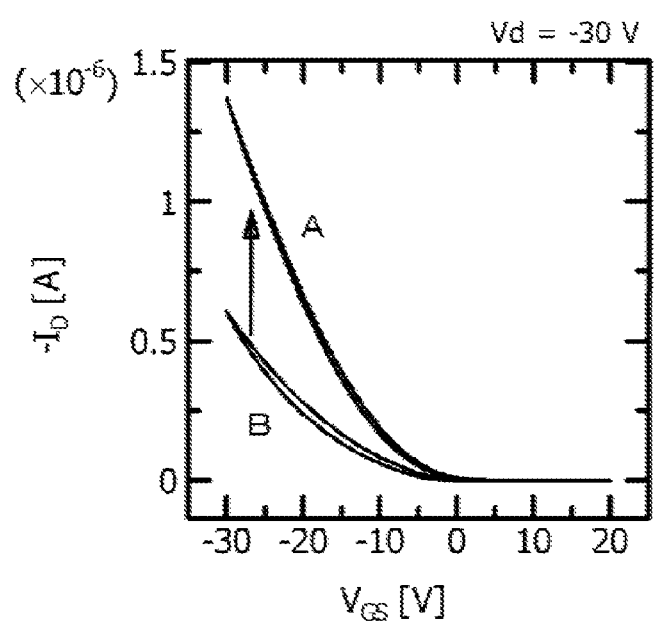
FIG. 11 is a graph illustrating a measurement result of effective mobility in the first embodiment and the comparative example.

In the first embodiment, since the charge injection layer 16 is formed, the value of the contact resistance between the source/drain electrodes 15 and the channel formation region extension 14A can be reduced by about 85% in comparison with a comparative example in which the charge injection layer 16 is not formed. In addition, an effective mobility can be enhanced. FIGS. 10 and 11 illustrate measurement results of contact resistance values and measurement results of the effective mobilities of the first embodiment and the comparative example, respectively. Here, the curves A and B in FIGS. 10 and 11 illustrate the measurement results of the first embodiment and the comparative example. The horizontal axis of FIG. 10 indicates a channel length (unit: $10^{-3}$ cm) and the vertical axis of FIG. 10 indicates the contact resistance (unit: $10^6$ Ω·cm). The value of the y-intercept is a contact resistance value. In addition, the horizontal axis of FIG. 11 indicates the gate-source voltage $V_{GS}$ (unit: V), and the vertical axis of FIG. 11 indicates the drain current $I_D$ (unit: $10^{-6}$ A). In addition, the drain voltage $V_d$ is constantly −30 V.

In addition, the charge injection layer-precursor layer may be formed of a derivative of TTF (in particular, MDT-TTF having a thickness of 5 nm) instead of TTF and the semiconductor device may be manufactured by the same method as in the first embodiment, thereby reducing the contact resistance by the same degree as in the first embodiment. Similarly, the charge injection layer-precursor layer may be formed of tetrathiapentalene, a derivative of tetrathiapentalene (in particular, TTM-TTP, CnTTM-TTP), tetrathiatetracene, or hexathiopentacene and the semiconductor device may be manufactured by the same method as in the first embodiment, thereby also reducing the contact resistance by the same degree as in the first embodiment.

In addition, the charge injection layer 16 is formed of an oxide of the organic compound having the monochalcogen six-membered ring. In particular, the charge injection layer-precursor layer is formed of pyranylidene or bithiapyrinylidene and the semiconductor device is manufactured by the same method as in the first method, thereby also reducing the contact resistance by the same degree as in the first embodiment.

Second Embodiment

The second embodiment relates to the electronic device according to the first to sixth aspects of the present disclosure, and in particular, relates to a bottom gate-top contact type TFT having a three-terminal structure and a method of manufacturing the semiconductor device according to the third and fourth aspects of the present disclosure.

In the bottom gate-top contact type TFT having the three-terminal structure of the second embodiment, as shown in FIG. 2D schematically illustrating the partial cross-sectional view, a gate electrode 22 formed on a base 21 is formed as a control electrode, a gate insulating layer 23 is formed on the gate electrode 22 and the base 21 as an insulating layer, a channel formation region 24 and a channel formation region extension 24A are formed on the gate insulating layer 23 as an active layer, a pair of source/drain electrodes 25 are formed above the channel formation region extension 24A as first and second electrodes, and a charge injection layer 26 is formed between each of the source/drain electrodes 25 and the channel formation region extension 24A.

Hereinafter, a method of manufacturing the semiconductor device of the second embodiment will be described with reference to FIGS. 2A to 2D illustrating partial cross-sectional views of the base or the like.

[Process-200]

First, the gate electrode 22 is formed on the base 21 in the same way as in [Process-100] of the first embodiment and then the gate insulating layer 23 is formed on the base 21 and the gate electrode 22 in the same way as in [Process-110] of the first embodiment (see FIG. 2A).

[Process-210]

Next, the channel formation region 24 and the channel formation region extension 24A formed of an organic semiconductor material are formed on the gate insulating layer 23 in the same way as in [Process-140] of the first embodiment (see FIG. 2B). In addition, although the organic semiconductor material layer may be patterned to obtain the channel formation region 24 and the channel formation region extension 24A as necessary, patterning the organic semiconductor material layer may be performed after [Process-220] to be described later or may also be performed after [Process-230].

[Process-220]

Next, in the same way as in [Process-130] of the first embodiment, the charge injection layer-precursor layer formed of an organic compound is formed on the channel formation region extension 24A, and then oxidation is performed on the charge injection layer-precursor layer. In this way, the charge injection layer 26 having a higher electric conductivity than the charge injection layer-precursor layer can be formed (see FIG. 2C). In addition, as described above, the organic compound includes at least one selected from the group including the Weitz type oxidation-reduction based organic compound, the organic compound having the cyclic structure in which the number of π electrons is 4n+3 (n is a positive integer), the organic compound having the dichalcogen five-membered ring, and the organic compound having the monochalcogen six-membered ring.

[Process-230]

Next, in the same way as in [Process-120] of the first embodiment, the pair of source/drain electrodes 25 are formed above the channel formation region extension 24A, in particular, on the charge injection layer 26 (see FIG. 2D).

In the second embodiment, with the formation of the charge injection layer 26, the value of the contact resistance between the source/drain electrodes 25 and the channel formation region extension 24A can also be decreased by the same degree as in the first embodiment in comparison with the comparative example in which the charge injection layer 26 is not formed.

In addition, the charge injection layer-precursor layer may be formed of a derivative of TTF instead of TTF (in particular, the derivative of TTF described in the first embodiment), and the semiconductor device may be manufactured by the same method as in the second embodiment, thereby reducing the contact resistance by the same degree as in the second embodiment. Similarly, the charge injection layer-precursor layer may be formed of tetrathiapentalene, a derivative of tetrathiapentalene (in particular, the derivative of tetrathiapentalene described in the first embodiment), tetrathiatetracene, or hexathiopentacene, and the semiconductor device may be manufactured by the similar method as in the second embodiment, thereby also reducing the contact resistance by the same degree as in the second embodiment.

In addition, the charge injection layer may be configured of an oxide of an organic compound having a monochalcogen six-membered ring, in particular, the charge injection layer-precursor layer may be configured of pyranylidene, a derivative of pyranylidene (in particular, the derivative of pyranylidene described in the first embodiment), bithiapyrinylidene, a derivative of bithiapyrinylidene (in particular, the derivative of bithiapyrinylidene described in the first embodiment) and the semiconductor device may be manufactured by the same method as in the second embodiment, thereby also reducing the contact resistance by the same degree as in the second embodiment.

Third Embodiment

The third embodiment is a modified example of the method of manufacturing the semiconductor device described in the second embodiment.

Hereinafter, a method of manufacturing the semiconductor device of the third embodiment will be described with reference to FIGS. 3A to 3D schematically illustrating partial cross-sectional views of the base or the like.

[Process-300]

First, the gate electrode 22 is formed on the base 21 in the same way as in [Process-100] of the first embodiment, and then the gate insulating layer 23 is formed on the base 21 and the gate electrode 22 in the same way as in [Process-110] of the first embodiment.

[Process-310]

Next, in the same way as in [Process-140] of the first embodiment, an organic semiconductor material layer 24B formed of an organic semiconductor material is formed on the gate insulating layer 23, and then a charge injection layer-precursor layer formed of an organic compound is formed on the organic semiconductor material layer 24B on the basis of a spin coating method. The charge injection layer-precursor layer is then oxidized. It is thus possible to form the charge injection layer 26 having a higher electric conductivity than the charge injection layer-precursor layer (see FIG. 3A). The charge injection layer 26 and the organic semiconductor material layer 24B are then patterned, thereby obtaining the structure having the channel formation region 24, the channel formation region extension 24A, and the charge injection layer 26 formed on the channel formation region 24 and the channel formation region extension 24A (see FIG. 3B).

[Process-320]

Next, in the same way as in [Process-120] of the first embodiment, the pair of source/drain electrodes 25 is formed above the channel formation region extension 24A, in particular, on the charge injection layer 26 (see FIG. 3C). In addition, the source/drain electrodes 25 are also formed on side surfaces of the channel formation region extension 24A and the charge injection layer 26 in some cases.

[Process-330]

Next, a portion of the charge injection layer 26 on the channel formation region 24 is removed by etching using the source/drain electrodes 25 as an etching mask (see FIG. 3D). As for the etching, for example, a wet etching method using a poor solvent such as ethanol or a dry etching method for the organic semiconductor material may be employed. This also applies to the fourth embodiment or the seventh embodiment in the same way.

Fourth Embodiment

The fourth embodiment is also a modified example of the second embodiment.

Hereinafter, a method of manufacturing the semiconductor device of the fourth embodiment will be described with reference to FIGS. 4A to 4D schematically illustrating partial cross-sectional views of the base or the like.

[Process-400]

First, the gate electrode 22 is formed on the base 21 in the same way as in [Process-100] of the first embodiment, and then the gate insulating layer 23 is formed on the base 21 and the gate electrode 22 in the same way as in [Process-110] of the first embodiment.

[Process-410]

Next, in the similar way as in [Process-140] of the first embodiment, the organic semiconductor material layer 24B formed of the organic semiconductor material is formed on the gate insulating layer 23, a photosensitive fluorine-based insulating material layer is then formed on the organic semiconductor material layer 24B located at a portion of the region at which the channel formation region is to be formed, and is subjected to exposure and development, thereby obtaining a protective layer 27.

[Process-420]

Next, a charge injection layer-precursor layer formed of the organic compound is formed on the organic semiconductor material layer 24B and the protective layer 27 on the basis of a spin coating method. The charge injection layer-precursor layer is then oxidized. It is thus possible to form the charge injection layer 26 having a higher electric conductivity than the charge injection layer-precursor layer (see FIG. 4A). The charge injection layer 26 and the organic semiconductor material layer 24B are then patterned, thereby obtaining the structure having the channel formation region 24, the channel formation region extension 24A, and the charge injection layer 26 formed on the protective layer 27 and the channel formation region extension 24A (see FIG. 4B).

[Process-430]

Next, in the similar way as in [Process-120] of the first embodiment, the pair of source/drain electrodes 25 are formed above the channel formation region extension 24A, in particular, on the charge injection layer 26 (see FIG. 4C). In addition, the source/drain electrodes 25 are also formed on side surfaces of the channel formation region extension 24A and the charge injection layer 26 in some cases.

[Process-440]

Next, using the source/drain electrodes 25 as an etching mask, a portion of the charge injection layer 26 on the channel formation region 24 is removed, for example, by a dry etching method using an oxygen gas (see FIG. 4D). When the portion of the charge injection layer 26 is removed by etching, the channel formation region is protected by the protective layer, 27, and it is thus possible to reliably prevent the channel formation region 24 from being damaged.

Fifth Embodiment

The fifth embodiment relates to an electronic device according to the first to sixth aspects of the present disclosure, in particular, relates to a top gate-bottom contact type TFT having the three-terminal structure and a method of manufacturing the semiconductor device according to the fifth and sixth aspects of the present disclosure.

In the top gate-bottom contact type TFT having the three-terminal structure of the fifth embodiment, as shown in FIG. 5D schematically illustrating the partial cross-sectional view, a pair of source/drain electrodes 35 are formed on a base 31 as first and second electrodes, a channel formation region 34 formed on the base 31 between the pair of source/drain electrodes 35 and a channel formation region extension 34A formed above the source/drain electrodes 35 are formed as an active layer, a gate insulating layer 33 is formed on the channel formation region 34 and the channel formation region extension 34A as an insulating layer, a gate electrode 32 is formed on the gate insulating layer 33 to face the channel formation region 34 as a control electrode, and a charge injection layer 36 is formed between the source/drain electrodes 35 and the channel formation region extension 34A.

Hereinafter, the method of manufacturing the semiconductor device of the fifth embodiment will be described with reference to FIGS. 5A to 5D schematically illustrating partial cross-sectional views of the base or the like.

[Process-500]

First, in the same way as in [Process-120] of the first embodiment, the pair of source/drain electrodes 35 are formed on the base 31 (see FIG. 5A).

[Process-510]

Next, in the same way as in [Process-130] of the first embodiment, a charge injection layer-precursor layer formed of an organic compound is formed on each of the source/drain electrodes 35, and then the charge injection layer-precursor layer is oxidized. It is thus possible to form the charge injection layer 36 having a higher electric conductivity than the charge injection layer-precursor layer (see FIG. 5B). In addition, as described above, the organic compound includes at least one organic compound selected from the group including the Weitz type oxidation-reduction based organic compound, the organic compound having the cyclic structure in which the number of π electrons is 4n+3 (n is a positive integer), the organic compound having the dichalcogen five-membered ring, and the organic compound having the monochalcogen six-membered ring.

[Process-520]

Next, in the same way as in [Process-140] of the first embodiment, the channel formation region 34 formed of the organic semiconductor material is formed between the pair of source/drain electrodes 35, and the channel formation region extension 34A formed of the organic semiconductor material is also formed above each of the source/drain electrodes 35, in particular, on the charge injection layer 36 (see FIG. 5C).

[Process-530]

Next, the gate insulating layer 33 is formed on the channel formation region 34 and the channel formation region extension 34A in the same way as in [Process-110] of the first embodiment, and then the gate electrode 32 is formed on a portion of the gate insulating layer 33 on the channel formation region 34 in the same way as in [Process-100] of the first embodiment (see FIG. 5D).

In the fifth embodiment, with the formation of the charge injection layer 36, the value of the contact resistance between the source/drain electrodes 35 and the channel formation region extension 34A can also be decreased by the same degree as in the first embodiment in comparison with the comparative example in which the charge injection layer 36 is not formed.

In addition, the charge injection layer-precursor layer may be formed of a derivative of TTF instead of TTF (in particular, the derivative of TTF described in the first embodiment), and the semiconductor device may be manufactured by the same method as in the fifth embodiment, thereby reducing the contact resistance by the same degree as in the fifth embodiment. Similarly, the charge injection layer-precursor layer may be formed of tetrathiapentalene, a derivative of tetrathiapentalene (in particular, the derivative of tetrathiapentalene described in the first embodiment), tetrathiatetracene, or hexathiopentacene, and the semiconductor device may be manufactured by the same method as in the fifth embodiment, thereby also reducing the contact resistance by the same degree as in the fifth embodiment.

In addition, the charge injection layer may be configured of an oxide of an organic compound having a monochalcogen six-membered ring, in particular, the charge injection layer-precursor layer may be configured of pyranylidene, a derivative of pyranylidene (in particular, the derivative of pyranylidene described in the first embodiment), bithiapyrinylidene, or a derivative of bithiapyrinylidene (in particular, the derivative of bithiapyrinylidene described in the first embodiment), and the semiconductor device may be manufactured by the same method as in the fifth embodiment, thereby also reducing the contact resistance by the same degree as in the fifth embodiment.

Sixth Embodiment

The sixth embodiment relates to an electronic device according to the first to sixth aspects of the present disclosure, in particular, relates to the top gate-top contact type TFT having the three-terminal structure and the method of manufacturing the semiconductor device according to the seventh and eighth aspects of the present disclosure.

In the top gate-top contact type TFT having the three-terminal structure of the sixth embodiment, as shown in FIG. 6D schematically illustrating the partial cross-sectional view, a channel formation region 44 and a channel formation region extension 44A are formed on a base 41 as an active layer, a pair of source/drain electrodes 45 are formed above the channel formation region extension 44A as first and second electrodes, a gate insulating layer 43 is formed on the pair of source/drain electrodes 45 and the channel formation region 44 as an insulating layer, a gate electrode 42 is formed on the gate insulating layer 43 as a control electrode, and a charge injection layer 46 is formed between the source/drain electrodes 45 and the channel formation region extension 44A.

Hereinafter, the method of manufacturing the semiconductor device of the sixth embodiment will be described with reference to FIGS. 6A to 6D schematically illustrating the partial cross-sectional views of the base or the like.

[Process-600]

First, the channel formation region 44 and the channel formation region extension 44A formed of an organic semiconductor material are formed on the base 41 in the same way as in [Process-140] of the first embodiment (see FIG. 6A).

[Process-610]

Next, in the same way as in [Process-130] of the first embodiment, a charge injection layer-precursor layer formed of an organic compound is formed on the channel formation region extension 44A, and then the charge injection layer-precursor layer is oxidized. It is thus possible to form the charge injection layer 46 having a higher electric conductivity than the charge injection layer-precursor layer (see FIG. 6B). In addition, as described above, the organic compound includes at least one organic compound selected from the group including the Weitz type oxidation-reduction based organic compound, the organic compound having the cyclic structure in which the number of π electrons is 4n+3 (n is a positive integer), the organic compound having the dichalcogen five-membered ring, and the organic compound having the monochalcogen six-membered ring.

[Process-620]

Next, the pair of source/drain electrodes 45 are formed above the channel formation region extension 44A, in particular, on the charge injection layer 46 in the same way as in [Process-120] of the first embodiment (see FIG. 6C).

[Process-630]

Next, the gate insulating layer 43 is formed on the channel formation region 44 and the pair of source/drain electrodes 45 in the same way as in [Process-110] of the first embodiment, and then the gate electrode 42 is formed on a portion of the gate insulating layer on the channel formation region 44 in the same way as in [Process-100] of the first embodiment (see FIG. 6D).

In the sixth embodiment, with the formation of the charge injection layer 46, the value of the contact resistance between the source/drain electrodes 45 and the channel formation region extension 44A can also be decreased by the same degree as in the first embodiment in comparison with the comparative example in which the charge injection layer 46 is not formed.

In addition, the charge injection layer-precursor layer may be formed of a derivative of TTF instead of TTF (in particular, the derivative of TTF described in the first embodiment), and the semiconductor device may be manufactured by the same method as in the sixth embodiment, thereby reducing the contact resistance by the same degree as in the sixth embodiment. Similarly, the charge injection layer-precursor layer may be formed of tetrathiapentalene, a derivative of tetrathiapentalene (in particular, the derivative of tetrathiapentalene described in the first embodiment), tetrathiatetracene, or hexathiopentacene, and the semiconductor device may be manufactured by the same method as in the sixth embodiment, thereby also reducing the contact resistance by the same degree as in the sixth embodiment.

In addition, the charge injection layer may be formed of an oxide of an organic compound having a monochalcogen six-membered ring, in particular, the charge injection layer-precursor layer may be formed of pyranylidene, a derivative of pyranylidene (in particular, the derivative of pyranylidene described in the first embodiment), bithiapyrinylidene, or a derivative of bithiapyrinylidene (in particular, the derivative of bithiapyrinylidene described in the first embodiment), and the semiconductor device may be manufactured by the same method as in the sixth embodiment, thereby also reducing the contact resistance by the same degree as in the sixth embodiment.

Seventh Embodiment

The seventh embodiment is a modified example of the method of manufacturing the semiconductor device described in the sixth embodiment.

Hereinafter, the method of manufacturing the semiconductor device of the seventh embodiment will be described with reference to FIGS. 7A to 7C schematically illustrating the partial cross-sectional views of the base or the like.
[Process-700]

First, an organic semiconductor material layer formed of an organic semiconductor material is formed on the base 41 in the same way as in [Process-140] of the first embodiment.
[Process-710]

Next, a charge injection layer-precursor layer formed of an organic compound is formed on the organic semiconductor material layer on the basis of a spin coating method. The charge injection layer-precursor layer is then oxidized. It is thus possible to form the charge injection layer 46 having a higher electric conductivity than the charge injection layer-precursor layer. The charge injection layer 46 and the organic semiconductor material layer are then patterned, thereby obtaining the structure having the channel formation region 44, the channel formation region extension 44A, and the charge injection layer 46 formed on channel formation region 44 and the channel formation region extension 44A (see FIG. 7A).
[Process-720]

Next, in the same way as in [Process-120] of the first embodiment, the pair of source/drain electrodes 45 are formed above the channel formation region extension 44A, in particular, on the charge injection layer 46 (see FIG. 7B). In addition, the source/drain electrodes 45 are also formed on side surfaces of the channel formation region extension 44A and the charge injection layer 46 in some cases.
[Process-730]

Next, a portion of the charge injection layer 46 on the channel formation region 44 is removed by etching using the source/drain electrodes 45 as an etching mask (see FIG. 7C).
[Process-740]

Next, the gate insulating layer 43 is formed on the channel formation region 44 and the pair of source/drain electrodes 45 in the same way as in [Process-110] of the first embodiment, and then the gate electrode 42 is formed on a portion of the gate insulating layer 43 on the channel formation region 44 in the same way as in [Process-100] of the first embodiment. It is thus possible to obtain the semiconductor device having the similar configuration and structure to that shown in FIG. 6D.

Eighth Embodiment

Figure 8B:
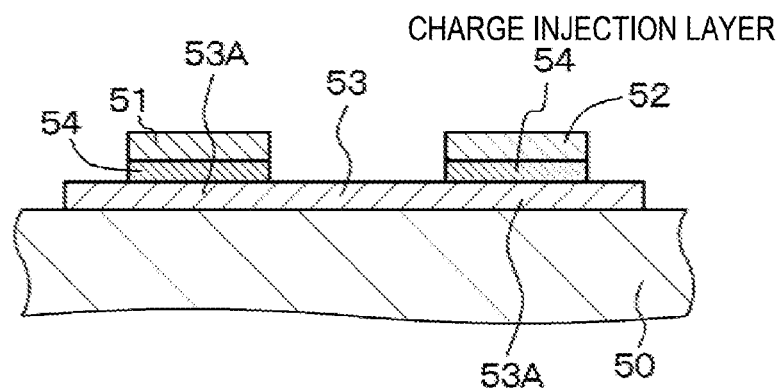

The eighth embodiment is a modified example of the fifth or sixth embodiment. However, in the eighth embodiment, in particular, the electronic device is a two-terminal type electronic device. Further, as shown in FIGS. 8A and 8B schematically illustrating partial cross-sectional views, the electronic device includes a first electrode 51, a second electrode, and an active layer 53 formed between the first electrode 51 and the second electrode 52. In addition, the active layer 53 is formed of an organic semiconductor material. Electric power is generated by irradiating light onto the active layer 53. That is, the electronic device of the eighth embodiment acts as a photoelectric conversion element or a solar cell. Alternatively, the electronic device acts as a light emitting element of which the active layer 53 emits light when a voltage is applied to the first electrode 51 and the second electrode 52. Here, a charge injection layer 54 is formed between the first electrode 51 and an active layer extension 53A and between the second electrode 52 and the active layer extension 53A. In addition, the reference numeral 50 indicates the base.

Except for the description above and that the control electrode and the insulating layer are not formed, the configuration and structure of the electronic device of the eighth embodiment can be fundamentally same as the configuration and structure of the electronic device described in the fifth or sixth embodiment, and the detailed description is thus omitted. The electronic device of the eighth embodiment may be obtained by performing the same processes as [Process-500] to [Process-520] of the fifth embodiment or the same processes as [Process-600] to [Process-620] of the sixth embodiment. In addition, the structure and configuration in which the first electrode, the charge injection layer, the active layer, the charge injection layer, and the second electrode are sequentially stacked on the base may be obtained in some cases.

Preferred embodiments of the present disclosure have been described, but the present disclosure is not limited to these embodiments. The structure or configuration, formation conditions, and manufacturing conditions of the electronic device or the semiconductor device are merely illustrative and may be modified as appropriate. For example, when the electronic device (semiconductor device) obtained in the present disclosure is applied to display devices or a variety of electronic equipment and used, it may be used as a monolithic integrated circuit of which the base or support is integrated with a number of electronic devices (semiconductor devices), and may also be used as a discrete part after the electronic devices (semiconductor devices) are individually diced.

Additionally, the present technology may also be configured as below.

[1] <<Electronic Device: First Aspect>>

An electronic device comprising at least:

a first electrode;

a second electrode disposed to be spaced apart from the first electrode; and an active layer disposed over the second electrode from above the first electrode and formed of an organic semiconductor material, wherein a charge injection layer is formed between the first electrode and the active layer and between the second electrode and the active layer, and the charge injection layer is formed of an organic material having an increased electric conductivity when the charge injection layer is oxidized.

[2] <<Electronic Device: Second Aspect>>

An electronic device comprising at least:

a first electrode;

a second electrode disposed to be spaced apart from the first electrode; and an active layer disposed over the second electrode from above the first electrode and formed of an organic semiconductor material, wherein a charge injection layer is formed between the first electrode and the active layer and between the second electrode and the active layer, and the charge injection layer is formed of an oxide of a Weitz type oxidation-reduction based organic compound.

[3] <<Electronic Device: Third Aspect>>

An electronic device comprising at least:

a first electrode;

a second electrode disposed to be spaced apart from the first electrode; and an active layer disposed over the second electrode from above the first electrode and formed of an organic semiconductor material, wherein a charge injection layer is formed between the first electrode and the active layer and between the second electrode and the active layer, and the charge injection layer is formed of an oxide of an organic compound having a cyclic structure in which the number of $\pi$ electrons is $4n+3$ (n is a positive integer).

[4] <<Electronic Device: Fourth Aspect>>

An electronic device comprising at least:

a first electrode;

a second electrode disposed to be spaced apart from the first electrode; and an active layer disposed over the second electrode from above the first electrode and formed of an organic semiconductor material, wherein a charge injection layer is formed between the first electrode and the active layer and between the second electrode and the active layer, and the charge injection layer is formed of an oxide of an organic compound including a dichalcogen five-membered ring.

[5] <<Electronic Device: Fifth Aspect>>

An electronic device comprising at least:

a first electrode;

a second electrode disposed to be spaced apart from the first electrode; and an active layer disposed over the second electrode from above the first electrode and formed of an organic semiconductor material, wherein a charge injection layer is formed between the first electrode and the active layer and between the second electrode and the active layer, and the charge injection layer is formed of an oxide of an organic compound including a monochalcogen six-membered ring.

[6] <<Electronic Device: Sixth Aspect>>

An electronic device comprising at least:

a first electrode;

a second electrode disposed to be spaced apart from the first electrode; and an active layer disposed over the second electrode from above the first electrode and formed of an organic semiconductor material, wherein a charge injection layer is formed between the first electrode and the active layer and between the second electrode and the active layer, and the charge injection layer is formed of an oxide of at least one organic compound selected from the group including tetrathiafulvalene and a derivative thereof, tetrathiapentalene and a derivative thereof, tetrathiatetracene, hexathiopentacene, pyranylidene and a derivative thereof, and bithiapyrinylidene and a derivative thereof.

[7] The electronic device according to any one of [1] to [6], further comprising:

an insulating layer; and a control electrode disposed to face a portion of the active layer located between the first electrode and the second electrode with the insulating layer interposed therebetween.

[8] <<Bottom Gate-Bottom Contact Type>>

The electronic device according to claim 7, wherein a gate electrode is formed on the base as the control electrode, a gate insulating layer is formed on the gate electrode and the base as the insulating layer, a pair of source/drain electrodes are formed on the gate insulating layer as the first and second electrodes, as the active layer, a channel formation region is formed on the gate insulating layer between the pair of source/drain electrodes and a channel formation region extension is also formed above the source/drain electrodes, and a charge injection layer is formed between the source/drain electrodes and the channel formation region extension.

[9] <<Bottom Gate-Top Contact Type>>

The electronic device according to [7], wherein a gate electrode is formed on the base as the control electrode, a gate insulating layer is formed on the gate electrode and the base as the insulating layer, a channel formation region and a channel formation region extension are formed on the gate insulating layer as the active layer, a pair of source/drain electrodes are formed above the channel formation region extension as the first and second electrodes, and a charge injection layer is formed between each of the source/drain electrodes and the channel formation region extension.

[10] <<Top Gate-Bottom Contact Type>>

The electronic device according to [7], wherein a pair of source/drain electrodes are formed on the base as the first and second electrodes, as the active layer, a channel formation region is formed on the base between the pair of source/drain electrodes and a channel formation region extension is also formed above the source/drain electrodes, a gate insulating layer is formed on the channel formation region and the channel formation region extension as the insulating layer, a gate electrode is formed on the gate insulating layer to face the channel formation region as the control electrode, and the charge injection layer is formed between each of the source/drain electrodes and the channel formation region extension.

[11] <<Top Gate-Top Contact Type>>

The electronic device according to [7], wherein a channel formation region and a channel formation region extension are formed on the base as the active layer, a pair of source/drain electrodes are formed above the channel formation region extension as the first and second electrodes, a gate insulating layer is formed on the pair of source/drain electrodes and the channel formation region as the insulating layer, a gate electrode is formed on the gate insulating layer as the control electrode, and the charge injection layer is formed between each of the source/drain electrodes and the channel formation region extension.

[12] <<Method of Manufacturing Semiconductor Device: First Aspect: Bottom Gate-Bottom Contact Type>>

A method of manufacturing a semiconductor device, comprising (A) forming a gate electrode on a base, and then forming a gate insulating layer on the base and the gate electrode;

(B) forming a pair of source/drain electrodes on the gate insulating layer; and (C) forming a channel formation region formed of an organic semiconductor material on the gate insulating layer disposed between the pair of source/drain electrodes and additionally forming a channel formation region extension formed of the organic semiconductor material above each of the source/drain electrodes, the method further comprising:

between processes (B) and (C), forming a charge injection layer-precursor layer formed of an organic compound on each of the source/drain electrodes, and then performing oxidation on the charge injection layer-precursor layer to form a charge injection layer having a higher electric conductivity than the charge injection layer-precursor layer.

[13] <<Method of Manufacturing Semiconductor Device: Second Aspect: Bottom Gate-Bottom Contact Type>>

A method of manufacturing a semiconductor device, comprising:

(A) forming a gate electrode on a base, and then forming a gate insulating layer on the base and the gate electrode;

(B) forming a pair of source/drain electrodes on the gate insulating layer; and (C) forming a channel formation region formed of an organic semiconductor material on the gate insulating layer disposed between the pair of source/drain electrodes and additionally forming a channel formation region extension formed of the organic semiconductor material above each of the source/drain electrodes, the method further comprising:

between processes (B) and (C), forming a charge injection layer-precursor layer formed of an organic compound on each of the source/drain electrodes, and then performing oxidation on the charge injection layer-precursor layer to form a charge injection layer, wherein the organic compound includes at least one organic compound selected from the group including a Weitz type oxidation-reduction based organic compound, an organic compound having a cyclic structure in which the number of $\pi$ electrons is 4n+3 (n is a positive integer), an organic compound having a dichalcogen five-membered ring, and an organic compound having a monochalcogen six-membered ring.

[14] <<Method of Manufacturing Semiconductor Device: Third Aspect: Bottom Gate-Top Contact Type>>

A method of manufacturing a semiconductor device, comprising:

(A) forming a gate electrode on a base, and then forming a gate insulating layer on the base and the gate electrode;

(B) forming a channel formation region and a channel formation region extension formed of an organic semiconductor material on the gate insulating layer; and (C) forming a pair of source/drain electrodes above the channel formation region extension, the method further comprising:

between processes (B) and (C), forming a charge injection layer-precursor layer formed of an organic compound on the channel formation region extension, and then performing oxidation on the charge injection layer-precursor layer to form a charge injection layer having a higher electric conductivity than the charge injection layer-precursor layer.

[15] <<Method of Manufacturing Semiconductor Device: Fourth Aspect: Bottom Gate-Top Contact Type>>

A method of manufacturing a semiconductor device, comprising:

(A) forming a gate electrode on a base, and then forming a gate insulating layer on the base and the gate electrode;

(B) forming a channel formation region and a channel formation region extension formed of an organic semiconductor material on the gate insulating layer; and (C) forming a pair of source/drain electrodes above the channel formation region extension, the method further comprising:

between processes (B) and (C), forming a charge injection layer-precursor layer formed of an organic compound on the channel formation region extension, and then performing oxidation on the charge injection layer-precursor layer to form a charge injection layer, wherein the organic compound includes at least one organic compound selected from the group including a Weitz type oxidation-reduction based organic compound, an organic compound having a cyclic structure in which the number of $\pi$ electrons is 4n+3 (n is a positive integer), an organic compound having a dichalcogen five-membered ring, and an organic compound having a monochalcogen six-membered ring.

[16] <<Method of Manufacturing Semiconductor Device: Fifth Aspect: Top Gate-Bottom Contact Type>>

A method of manufacturing a semiconductor device, comprising:

(A) forming a pair of source/drain electrodes on a base;

(B) forming a channel formation region formed of an organic semiconductor material between the pair of source/drain electrodes and additionally forming a channel formation region extension formed of the organic semiconductor material above each of the source/drain electrodes; and (C) forming a gate insulating layer on the channel formation region and the channel formation region extension, and then forming a gate electrode on a portion of the gate insulating layer on the channel formation region, the method further comprising:

between processes (A) and (B), forming a charge injection layer-precursor layer formed of an organic compound on each of the source/drain electrodes, and then performing oxidation on the charge injection layer-precursor layer to form a charge injection layer having a higher electric conductivity than the charge injection layer-precursor layer.

[17] <<Method of Manufacturing Semiconductor Device: Sixth Aspect: Top Gate-Bottom Contact Type>>

A method of manufacturing a semiconductor device, comprising:

(A) forming a pair of source/drain electrodes on a base;

(B) forming a channel formation region formed of an organic semiconductor material between the pair of source/drain electrodes and additionally forming a channel formation region extension formed of the organic semiconductor material above each of the source/drain electrodes; and (C) forming a gate insulating layer on the channel formation region and the channel formation region extension, and then forming a gate electrode on a portion of the gate insulating layer on the channel formation region, the method further comprising:

between processes (A) and (B), forming a charge injection layer-precursor layer formed of an organic compound on each of the source/drain electrodes, and then performing oxidation on the charge injection layer-precursor layer to form a charge injection layer, wherein the organic compound includes at least one organic compound selected from the group including a Weitz type oxidation-reduction based organic compound, an organic compound having a cyclic structure in which the number of π electrons is 4n+3 (n is a positive integer), an organic compound having a dichalcogen five-membered ring, and an organic compound having a monochalcogen six-membered ring.

[18] <<Method of Manufacturing Semiconductor Device: Seventh Aspect: Top Gate-Top Contact Type>>

A method of manufacturing a semiconductor device, comprising:

(A) forming a channel formation region and a channel formation region extension formed of an organic semiconductor material on a base;

(B) forming a pair of source/drain electrodes above the channel formation region extension; and (C) forming a gate insulating layer on the channel formation region and the pair of source/drain electrodes, and then forming a gate electrode on a portion of the gate insulating layer on the channel formation region, the method further comprising:

between processes (A) and (B), forming a charge injection layer-precursor layer formed of an organic compound on the channel formation region extension, and then performing oxidation on the charge injection layer-precursor layer to form a charge injection layer having a higher electric conductivity than the charge injection layer-precursor layer.

[19] <<Method of Manufacturing Semiconductor Device: Eighth Aspect: Top Gate-Top Contact Type>>

A method of manufacturing a semiconductor device, comprising:

(A) forming a channel formation region and a channel formation region extension formed of an organic semiconductor material on a base;

(B) forming a pair of source/drain electrodes above the channel formation region extension; and (C) forming a gate insulating layer on the channel formation region and the pair of source/drain electrodes, and then forming a gate electrode on a portion of the gate insulating layer on the channel formation region, the method further comprising:

between processes (A) and (B), forming a charge injection layer-precursor layer formed of an organic compound on the channel formation region extension, and then performing oxidation on the charge injection layer-precursor layer to form a charge injection layer, wherein the organic compound includes at least one organic compound selected from the group including a Weitz type oxidation-reduction based organic compound, an organic compound having a cyclic structure in which the number of π electrons is 4n+3 (n is a positive integer), an organic compound having a dichalcogen five-membered ring, and an organic compound having a monochalcogen six-membered ring.

[20] The method according to any one of [12] to [19], wherein the oxidation performed on the charge injection layer-precursor layer is natural oxidation under an air atmosphere.

The present disclosure contains subject matter related to that disclosed in Japanese Priority Patent Application JP 2011-148018 filed in the Japan Patent Office on Jul. 4, 2011, the entire content of which is hereby incorporated by reference.

What is claimed is:

1. A method of manufacturing a semiconductor device, comprising:

forming a gate electrode on a base;

forming a gate insulating layer on the base and the gate electrode;

forming a channel formation region and channel extension regions of an organic semiconductor material on the gate insulating layer;

forming charge-injection precursor layers of an organic compound on the channel extension regions;

performing oxidation on the charge-injection precursor layers to form charge-injection layers; and forming a pair of source/drain electrodes above the channel extension regions and charge-injection layers, wherein the organic compound comprises at least one organic compound selected from the group consisting of: a Weitz type oxidation-reduction based organic compound, an organic compound having a cyclic structure in which the number of π electrons is 4n+3 (n is a positive integer), an organic compound having a dichalcogen five-membered ring, and an organic compound having a monochalcogen six-membered ring.

2. A method of manufacturing a semiconductor device, comprising:

forming a channel formation region and channel extension regions of an organic semiconductor material on a substrate;

forming charge-injection precursor layers of an organic compound adjacent the channel extension regions;

performing oxidation on the charge-injection precursor layers to form charge-injection layers;

forming a pair of source/drain electrodes adjacent the charge-injection layers;

forming a gate insulating layer adjacent at least the channel formation region; and forming a gate electrode adjacent the gate insulating layer, wherein the organic compound includes at least one organic compound selected from the group consisting of: a Weitz type oxidation-reduction based organic compound, an organic compound having a cyclic structure in which the number of π electrons is 4n+3 (n is a positive integer), an organic compound having a dichalcogen five-membered ring, and an organic compound having a monochalcogen six-membered ring.

3. The method according to claim 2, wherein the oxidation performed on the charge-injection precursor layers is natural oxidation under an air atmosphere.

4. The method according to claim 2, further comprising forming a protective layer adjacent the channel formation region.

5. The method according to claim 4, wherein the protective layer comprises a photosensitive fluorine-based insulating material.

6. The method according to claim 4, wherein forming the protective layer comprises photoexposing and developing steps.

7. The method according to claim 2, wherein the charge-injection layer is formed to have a thickness of 5 nm.

* * * * *